(12) United States Patent
Liu et al.

(10) Patent No.: US 12,278,411 B2
(45) Date of Patent: Apr. 15, 2025

(54) RADIO FREQUENCY INVERTER, TRANSMISSION LINE PHASE SHIFTER, SYSTEM, CHIP, AND RADAR SENSOR

(71) Applicant: CALTERAH SEMICONDUCTOR TECHNOLOGY (SHANGHAI) CO., LTD., Shanghai (CN)

(72) Inventors: Tao Liu, Shanghai (CN); Zhengdong Liu, Shanghai (CN); Wenting Zhou, Shanghai (CN); Jiashu Chen, Shanghai (CN)

(73) Assignee: Calterah Semiconductor Technology (Shanghai) Co., Ltd., Shanghai (CN)

( * ) Notice: Subject to any disclaimer, the term of this patent is extended or adjusted under 35 U.S.C. 154(b) by 312 days.

(21) Appl. No.: 18/149,616

(22) Filed: Jan. 3, 2023

(65) Prior Publication Data
US 2024/0113406 A1 Apr. 4, 2024

Related U.S. Application Data

(63) Continuation of application No. PCT/CN2022/123131, filed on Sep. 30, 2022.

(51) Int. Cl.
*H01P 1/18* (2006.01)
*H01Q 3/26* (2006.01)
(Continued)

(52) U.S. Cl.
CPC ............ *H01P 1/184* (2013.01); *H01Q 3/2617* (2013.01); *H01Q 3/36* (2013.01); *G01S 13/06* (2013.01)

(58) Field of Classification Search
CPC ........ H01Q 3/2617; H01Q 3/36; H01P 1/184; H01P 5/184; G01S 13/06
See application file for complete search history.

(56) References Cited

U.S. PATENT DOCUMENTS 10,075,159 B1 9/2018 Birkbeck
10,291,282 B1 5/2019 Lin et al.
(Continued)

FOREIGN PATENT DOCUMENTS

CN 1525632 A 9/2004
CN 1747307 A 3/2006
(Continued)

OTHER PUBLICATIONS

Calterah Semiconductor Technology (shanghai) Co.,Ltd., International Search Report with English translation, PCT/CN2022/123131, Apr. 28, 2023, 5 pgs.
(Continued)

*Primary Examiner* — Quan Tra
(74) *Attorney, Agent, or Firm* — USCH Law, PC

(57) ABSTRACT

A radio frequency (RF) inverter, a transmission line phase shifter, a system, a chip, and a radar sensor are provided. The RF inverter includes an inductance circuit and a first phase adjusting circuit that both are arranged symmetrically along a same symmetry axis. The inductance circuit includes a single-ended signal interface and a differential signal interface. The first phase adjusting circuit includes two controlled switches, and each controlled switch is connected between the ground wire and a corresponding ground terminal of a pair of ground terminals in the single-ended signal interface, to enable the inductance circuit to perform in-phase or inverting phase shifting on a received RF signal.

20 Claims, 7 Drawing Sheets

(51) Int. Cl.
*H01Q 3/36* (2006.01)
*G01S 13/06* (2006.01)

(56) References Cited

U.S. PATENT DOCUMENTS

| | | | |
|---|---|---|---|
| 2018/0131338 A1* | 5/2018 | Shimura | H03H 11/245 |
| 2019/0158068 A1 | 5/2019 | Valdes Garcia et al. | |
| 2019/0198957 A1* | 6/2019 | Sharma | H03H 11/22 |
| 2022/0231391 A1* | 7/2022 | Wang | H03H 7/20 |

FOREIGN PATENT DOCUMENTS

| | | |
|---|---|---|
| CN | 101194420 A | 6/2008 |
| CN | 102099957 A | 6/2011 |
| CN | 103066940 A | 4/2013 |
| CN | 104247278 A | 12/2014 |
| CN | 107546457 A | 1/2018 |
| CN | 109616723 A | 4/2019 |
| CN | 112039493 A | 12/2020 |
| CN | 113675550 A | 11/2021 |
| CN | 113889720 A | 1/2022 |
| CN | 114122648 A | 3/2022 |
| JP | 2004088591 A | 3/2004 |
| JP | 2017126981 A | 7/2017 |
| JP | 7087215 B1 | 6/2022 |
| JP | 7111880 B1 | 8/2022 |
| TW | 201131881 A | 9/2011 |
| TW | I663842 B | 6/2019 |
| WO | 2020157804 A1 | 8/2020 |

OTHER PUBLICATIONS

Calterah Semiconductor Technology (shanghai) Co.,Ltd., International Search Report with English translation, PCT/CN2022/123129, Apr. 28, 2023, 6 pgs.

Calterah Semiconductor Technology (shanghai) Co.,Ltd., International Search Report with English translation, PCT/CN2022/123130, Apr. 28, 2023, 5 pgs.

Calterah Semiconductor Technology (shanghai) Co.,Ltd., International Search Report with English translation, PCT/CN2022/123127, Apr. 28, 2023, 5 pgs.

Calterah Semiconductor Technology (Shanghai) Co., Ltd., JP First Office Action with English translation, JP 2023-581068, Dec. 13, 2024, 16 pgs.

* cited by examiner

RADIO FREQUENCY INVERTER, TRANSMISSION LINE PHASE SHIFTER, SYSTEM, CHIP, AND RADAR SENSOR

CROSS REFERENCE TO RELATED APPLICATIONS

The present application is a continuation of PCT Patent Application No. PCT/CN2022/123131, filed Sep. 30, 2022, which is incorporated by reference herein in its entirety.

TECHNICAL FIELD

The disclosure relates to the technical field of radio frequency (RF) phase shifting, and more particularly to a radio frequency (RF) inverter, a transmission line phase shifter, a system, a chip, and a radar sensor.

BACKGROUND

In many wireless scenarios, especially in the field of wireless communication and radar sensors, radio frequency (RF) circuits having phase control capabilities can greatly improve information capacity, anti-interference ability, or improve directivity of detection and communication.

Therefore, a phase shifter is introduced in the RF circuit to enable a terminal device to have the phase control capability. Performance of the RF circuit is affected by phase-shifting accuracy, phase-shifting precision, calibration complexity, a calibration duration, and a calibration bandwidth of the phase shifter.

SUMMARY

In view of technical deficiencies existed in related technologies, embodiments of the disclosure aim to provide a radio frequency (RF) inverter, a transmission line phase shifter, a system, a chip, and a radar sensor.

According to a first aspect of the disclosure, a RF inverter is provided. The RF inverter includes an inductance circuit arranged symmetrically along a symmetry axis and a first phase adjusting circuit arranged symmetrically along the symmetry axis. The inductance circuit includes a single-ended signal interface and a differential signal interface. The first phase adjusting circuit includes two controlled switches, and each controlled switch is connected between the ground wire on a side of the single-ended signal interface and a corresponding ground terminal of a pair of ground terminals in the single-ended signal interface, to enable the inductance circuit to perform in-phase or inverting phase shifting on a received RF signal.

According to a second aspect of the disclosure, a phase shifting system is provided and includes a transmission line phase shifter and the RF inverter as described in the first aspect. The transmission line phase shifter includes a single-ended transmission line phase shifter coupled to a single-ended signal interface of the RF inverter; or the transmission line phase shifter includes a differential transmission line phase shifter coupled to the differential signal interface of the RF inverter.

According to a third aspect of the disclosure, a RF chip is provided and includes the phase shifting system as described in the second aspect.

According to a fourth aspect of the disclosure, a radar sensor is provided and includes a transmitting antenna configured to radiate a RF transmitting signal in a form of a detection signal wave. The receiving antenna is configured to convert an echo signal wave detected into a RF receiving signal, where the echo signal wave is formed by reflection of a detection signal wave by an object. The RF chip according to the third aspect is coupled to the transmitting antenna and the receiving antenna, and is configured to output a RF transmitting signal with phase shift to the transmitting antenna and convert the RF receiving signal into a baseband digital signal.

According to a fifth aspect of the disclosure, an apparatus is provided and includes: a radar sensor or a RF chip as described in the foregoing aspects, and an apparatus body, where the radar sensor or the RF chip is arranged on the apparatus body.

BRIEF DESCRIPTION OF THE DRAWINGS

The above and other objects, features, and advantages of the disclosure may become more apparent by describing exemplary embodiments of the disclosure in detail with reference to the accompanying drawings. The accompanying drawings described below are merely some embodiments of the disclosure and are not limiting to the disclosure.

DETAILED DESCRIPTION OF THE EMBODIMENTS

Figure 1A:
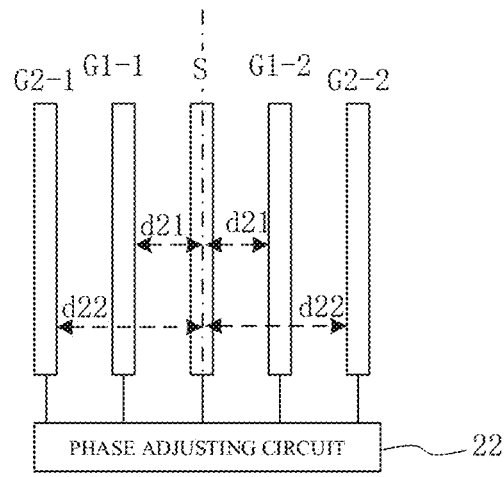
FIGS. 1A and 1B are principle schematic diagrams illustrating a transmission line phase-shifting unit according to exemplary embodiments of the disclosure.

Exemplary embodiments may be described more fully with reference to the accompanying drawings. However, the exemplary embodiments can be implemented in a variety of forms and should not be construed as being limited to the embodiments set forth herein. Instead, these embodiments are provided to make the disclosure comprehensive and complete and the idea of the exemplary embodiments will be fully conveyed to those skilled in the art. In the figures, same reference numerals denote same or similar parts and thus repetitive descriptions thereof will be omitted.

The described features, structures, or characteristics may be incorporated in one or more embodiments in any suitable manner. In the following illustration, many specific details are provided to give a full understanding of the embodiments of the disclosure. However, those skilled in the art will appreciate that the disclosed technical solutions may be practiced without one or more of these specific details, or implemented with other manners, components, materials, devices, etc.

The flow charts illustrated in the accompanying drawings are merely illustrative and are not necessarily to include all contents and operations/steps nor are they necessarily to be performed in the order described. For example, some operations/steps can also be decomposed, while other operations/steps can be merged or partially merged, so the actual order of execution may change according to the actual situation.

The terms "first", "second", etc. in the specification and claims of the disclosure and the above drawings are used to distinguish different objects rather than describe a specific order. Furthermore, the terms "including/comprising" and "having" and any variations thereof are intended to cover non-exclusive inclusion.

Those skilled in the art will appreciate that the accompanying drawings are merely schematic diagrams of the exemplary embodiments and the modules or processes in the drawings are not necessarily necessary for carrying out the disclosure and therefore cannot be used to limit the scope of the disclosure.

The following describes a radar sensor including a phase shifter as an example. According to a working mode configured in the radar sensor, the phase shifter performs a phase shifting operation on a local oscillator signal (also known as a LO signal) and converts the LO signal subjected to the phase shifting into a detection signal wave through a transmitting antenna to be radiated to a free space. When the detection signal wave radiated by the transmitting antenna is reflected by an object to form an echo signal wave, a receiving antenna converts the echo signal wave into a radio frequency (RF) receiving signal. The RF receiving signal is mixed with the LO signal, and then a baseband signal is output. The baseband signal carries phase shifting information provided by the phase shifter, so that a signal processor of the radar sensor can accurately extract a relative physical measurement value of the object from the baseband signal.

In some examples of the radar sensor, the phase shifter is implemented with an in-phase and quadrature (IQ) phase shifter. That is, the phase shifter is configured to convert an input RF signal into an in-phase signal and a quadrature signal, adjust an amplitude of the in-phase signal and an amplitude of the quadrature signal according to a phase shifting control signal, and obtain any phase-shifted RF signal through vector synthesis. However, the IQ phase shifter is an active device, and thus, when pressure voltage temperature (PVT) process changes, the IQ phase shifter is hard to be in a stable state. In addition, the IQ phase shifter has obvious nonlinear characteristics, and thus there is a need to adopt single-point calibration. For example, preset phase shifting points need to be calibrated one by one. It can be understood that complexity of the calibration and a time length for the calibration may limit working efficiency of the radar sensor.

Embodiments of the disclosure provide a transmission line phase shifter. The transmission line phase shifter includes at least one transmission line phase-shifting unit. Each transmission line phase-shifting unit includes a plurality of groups of transmission lines (with or without ground wires) and a plurality of phase adjusting circuits. Different groups of transmission lines have different closed path lengths for RF currents, and correspondingly equivalent inductances are different. Some phase adjusting circuits of the phase adjusting circuits are connected between the plurality of groups of transmission lines or between a respective transmission line and a corresponding ground wire for switching signals to be transmitted on different transmission lines or different ground wires, so as to adjust an equivalent inductance L corresponding to transmission lines. Therefore, the some phase adjusting circuits are referred to as an inductance adjusting circuit. In the remaining phase adjusting circuits of the phase adjusting circuits, at least one switched capacitor is connected between different transmission lines or between a respective transmission line and a corresponding ground wire, so as to adjust an equivalent capacitance C corresponding to the transmission lines, so the remaining phase adjusting circuits are referred to as a capacitance adjusting circuit. Since an insertion phase $\varphi$ of the transmission line phase-shifting unit has a corresponding relationship $\varphi=\omega(\sqrt{LC})$ with the equivalent inductance L and the equivalent capacitance C, an insertion phase $\varphi$ of the transmission line phase-shifting unit can be adjusted by the plurality of phase adjusting circuits (i.e., the inductance adjusting circuit and the capacitance adjusting circuit), such that phase shifting can be realized. The insertion phase generally refers to a phase shift between an input signal and a corresponding output signal.

By controlling a state of a corresponding phase adjusting circuit, the transmission line phase-shifting unit can be configured to have at least two states, for example, a first phase state (also called a reference state) and a second phase state (also called a phase shifting state). An equivalent inductance and an equivalent capacitance of the transmission line phase-shifting unit in the first phase state are respectively denoted as L1 and C1, and an equivalent inductance and an equivalent capacitance of the transmission line phase-shifting unit in the second phase state are respectively denoted as L2 and C2 respectively. An insertion phase of the transmission line phase-shifting unit in the first phase state is denoted as $\varphi_1$, and an insertion phase of the transmission line phase-shifting unit in the second phase state is denoted as $\varphi_2$. A difference between the insertion phase of the transmission line phase-shifting unit in the first phase state (reference state) and the insertion phase of the transmission line phase-shifting unit in the second phase state (phase shifting state) is called a phase shifting amount, which is denoted as $\Delta\varphi$. Therefore, $\Delta\varphi=\varphi_2-\varphi_1=\omega(\sqrt{L_2C_2})-\omega(\sqrt{L_1C_1})$ In other embodiments, the transmission line phase-shifting unit can also be configured to have three or more states. As can be seen, the phase adjusting circuit can adjust electrical parameters of a transmission path where each of the plurality of transmission lines is located according to at least one channel of phase shifting control signal received, so that a RF signal output from the transmission line phase-shifting unit has a phase shift of at least a first phase (first phase shift) or a second phase (second phase shift) relative to an input RF signal of the transmission line phase-shifting unit.

In terms of basic structure types of transmission lines, the transmission line phase-shifting unit generally includes a single-ended transmission line phase-shifting unit and a differential transmission line phase-shifting unit.

As an example, a transmission line phase-shifting unit constituted by single-ended transmission lines includes a single-ended signal line, a first pair of ground wires, and a second pair of ground wires. As illustrated in FIG. 1A, a single-ended signal line S and a first pair of ground wires (G1-1, G1-2) constitute a first group of transmission lines, and the single-ended signal line S and a second pair of ground wires (G2-1, G2-2) constitute a second group of transmission lines. Different equivalent inductances are realized by using a difference between a spacing between each of the first pair of ground wires and the signal line as well as a spacing between each of the second pair of ground wires and the signal line. Different equivalent capacitances are realized by using switched capacitors between the signal line and a corresponding ground wire. A circuit for switching different ground wires and the switched capacitors are all included in a phase adjusting circuit 22.

Figure 1B:
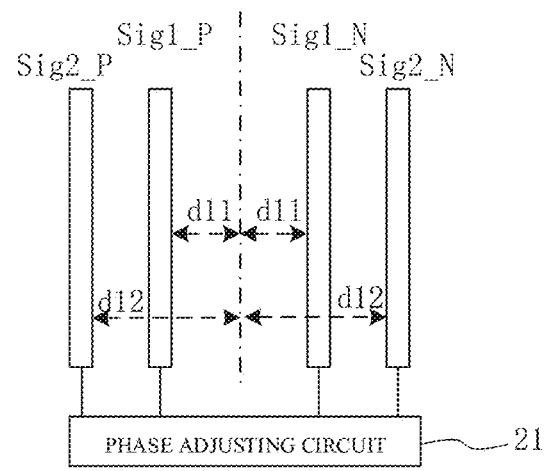

As another example, a transmission line phase-shifting unit constituted by differential transmission lines includes a first pair of differential transmission lines, a second pair of differential transmission lines, and a ground wire, where the ground wire is optional. As shown in FIG. 1B, signal lines Sig1_P and Sig1_N constitute a first group of transmission lines, and signal lines Sig2_P and Sig2_N constitute a second group of transmission lines. The signal lines Sig1_P and Sig1_N and the signal lines Sig2_P and Sig2_N are all differential transmission lines. Different equivalent inductances are realized by using a difference between a spacing between the first group of differential transmission lines PN and a spacing between the second group of differential transmission lines PN. Different equivalent capacitances are realized by using switched capacitors between differential transmission lines. A circuit for switching different differential transmission lines and the switched capacitors are all included in a phase adjusting circuit 21.

In order to enable the transmission line phase-shifting unit have stable electrical characteristics and good differential symmetry (the latter is merely for the differential transmission line phase-shifting unit), the transmission line phase-shifting unit is generally symmetric, where an axis of symmetry (also known as a symmetry axis) is a center line of the transmission line phase-shifting unit and is parallel to a direction of signal transmission, such as a virtual axis line (a dash-dotted line) in FIG. 1A or FIG. 1B. The virtual axis line is used for indicating that the transmission lines are symmetrical and is not a physical transmission line. The physical transmission line may overlap or partially overlap with the virtual axis line. For example, as shown in FIG. 1A, the signal line S in the single-ended transmission line phase-shifting unit is overlapped with the virtual axis line. The ground wire G1-1 and the ground wire G1-2 in the first pair of ground wires have an equal first spacing d21 with respect to the signal line S. The ground wire G2-1 and the ground wire G2-2 in the second pair of ground wires have an equal second spacing d22 with respect to the signal line S. For another example, the physical transmission line may be not overlapped with the virtual axis line. As shown in FIG. 1B, the signal line Sig1_P and the signal line Sig1_N in the first pair of differential transmission lines in the differential transmission line phase-shifting unit have an equal first spacing d11 with respect to the virtual axis line (a dash-dotted line in the figure). The signal line Sig2_P and the signal line Sig2_N in the second pair of differential transmission lines have an equal second spacing d12 with respect to the virtual axis.

It is to be noted that physical variables such as the phase shifting amount, and the spacing, etc. involved in the disclosure are to be understood as physical variables falling within an engineering error range.

It is also to be noted that FIGS. 1A and 1B show layout of the single-ended transmission line phase-shifting unit and the differential transmission line phase-shifting unit, where all the groups of transmission lines are located on a same metal layer. In other examples, all the groups of transmission lines are located on different metal layers, or even on stacked metal layers. In addition, in the example of FIGS. 1A and 1B, a spacing between a group of transmission lines corresponding to a smaller insertion phase is less than a spacing between another group of transmission lines corresponding to a larger insertion phase. In other examples, the spacing between each of different groups of transmission lines may also be the same/similar, and different groups of transmission lines correspond to different transmission line lengths, to enable an equivalent inductance L/equivalent capacitance C corresponding to each group of transmission lines to achieve a desired adjustment range. Therefore, a desired phase shifting amount $\Delta\varphi$ is achieved, and impedance matching may be maintained during phase shifting.

The phase adjusting circuit is a circuit designed according to the above principle for outputting at least one channel of phase shifting control signal. The phase shifting control signal is provided according to the number of controlled devices and controlled electrical parameters in the phase adjusting circuit. In some examples, one phase shifting control signal is used for controlling the controlled devices according to adjustable electrical parameters, such as a voltage, a current, and a duty cycle of the phase-shifting control signal. For example, a voltage of one channel of phase shifting control signal can be used for adjusting an on/off state of a switch tube. For another example, a voltage (or current) of another channel of phase shifting control signal can enable the switch tube to provide different impedance in a linear region range. Alternatively, a voltage (or current) of yet another channel of phase shifting control signal can enable the switch tube to be in a cut-off region or saturation region. Alternatively, a duty cycle of yet another channel of phase shifting control signal can adjust a charging/discharging time length of a capacitor, to further adapt a corresponding phase state switching due to a change of capacitance of the capacitor. In other examples, multi-channel of phase shifting control signals constitute a coded signal to control a controlled array to adjust a capacitance parameter and/or inductance parameter of the whole circuit. For example, the multi-channel of phase shifting control signals can adjust the number of on/off switches in the controlled switch array to adjust the corresponding capacitance parameters and/or inductance parameters.

Therefore, the phase adjusting circuit in the transmission line phase-shifting unit may include a switch tube for switching different groups of transmission lines, or a switch tube for causing different groups of transmission lines to transmit RF signals of different flow amounts, etc. Correspondingly, a switch tube manufactured by a semiconductor process can be switched in a saturation region or a cut-off region according to a phase shifting control signal. A resistance value of another switch tube manufactured by the semiconductor process can be adjusted in a linear region between the saturation region and the cut-off region by adjusting the phase shifting control signal, so that different groups of transmission lines transmit shunted RF signals. The phase adjusting circuit may further include capacitors and resistors to adapt the capacitance and/or resistance values in the equivalent circuit required for the corresponding phase state, i.e., to change the capacitance parameters and/or inductance parameters of the transmission line phase-shifting unit. In this way, it is possible to achieve phase shifting of the RF signal, and further realize impedance matching between the transmission line phase-shifting unit and an external circuit. The external circuit is, for example, a driving amplifier circuit in a RF chip, or other circuits for receiving a RF signal subjected to phase shifting, etc.

According to the above formula of the phase shifting amount, the phase adjusting circuit can independently adjust the equivalent inductance or the equivalent capacitance in the transmission line phase-shifting unit. In order to keep the transmission lines to be in a matching state before and after phase shifting, characteristic impedance $Z_C$ of the transmission lines before and after phase shifting is required to remain unchanged. According to a formula $$Z_C = \sqrt{\frac{L_1}{C_1}} = \sqrt{\frac{L_2}{C_2}},$$

a ratio of the equivalent inductance L to the equivalent capacitance C should be kept unchanged before and after the phase shifting. Therefore, it is necessary to adjust the equivalent inductance and the equivalent capacitance. For the RF circuit, when some electronic devices (such as different groups of transmission lines and switch tubes) are adjusted, capacitance parameters and inductance parameters may be changed at the same time. The types of different controlled circuits in the phase adjusting circuit described in the disclosure should be distinguished and understood from the perspective of mainly adjusting the capacitance parameters or inductance parameters of the whole transmission line phase-shifting unit.

The phase adjusting circuits include the inductance adjusting circuit. The inductance adjusting circuit is configured to adjust inductance parameters (e.g., inductances or resistance values) of the transmission line phase-shifting unit under the control of the phase shifting control signal, so that the transmission line phase-shifting unit performs a phase shifting operation according to the first phase or the second phase.

In some examples, group-based selection of different groups of transmission lines is performed by using controlled devices such as switch tubes and adjustable resistors, or switch tubes and adjustable inductors, so that the transmission line phase-shifting unit achieves state switching in the first phase or the second phase.

The following describes a single-ended transmission line phase-shifting unit as an example of the transmission line phase-shifting unit. In some examples, the inductance adjusting circuit is a circuit used for performing switching between a first pair of ground wires or a second pair of ground wires. For example, the inductance adjusting circuit includes a switch tube SW_1 connected between the ground wire G1-1 in the first pair of ground wires and the ground wire G2-1 in the second pair of ground wires, and a switch tube SW_2 connected between the ground wire G1-2 in the first pair of ground wires and the ground wire G2-2 in the second pair of ground wires. When the transmission line phase-shifting unit is configured in the first phase state, the switch tube SW_1 and the switch tube SW_2 are switched on, so that the phase shifting operation is performed through the single-ended signal line S and the first pair of ground wires (G1-1, G1-2). When the transmission line phase-shifting unit is configured in the second phase state, the switch tube SW_1 and the switch tube SW_2 are turned off, so that the phase shifting operation is performed through the single-ended signal line S and the second pair of ground wires (G2-1, G2-2).

In other examples, the inductance adjusting circuit is a circuit for adjusting flow amounts of RF signals in the first pair of ground wires and the second pair of ground wires. For example, the inductance adjusting circuit includes a switch tube (e.g., a metal oxide semiconductor tube) MOS_1 connected between the ground wire G1-1 in the first pair of ground wires and the ground wire G2-1 in the second pair of ground wires, and a switch tube (e.g., a metal oxide semiconductor tube) MOS_2 connected between the ground wire G1-2 in the first pair of ground wires and the ground wire G2-2 in the second pair of ground wires. When the phase shifting operation is performed on input RF signals according to the first phase, the switch tube MOS_1 and the switch tube MOS_2 are operated in the saturation region or the linear region, such that a flow amount of RF signals flowing through a transmission path in which the single-ended signal line S and the first pair of ground wires (G1-1, G1-2) are located is greater than a flow amount of RF signals flowing through a transmission path in which the single-ended signal line S and the second pair of ground wires (G2-1, G2-2) are located. When the phase shifting operation is performed on the input RF signals according to the second phase, the switch tube MOS_1 and the switch tube MOS_2 are operated in the cut-off region or the linear region, such that the flow amount of the RF signals flowing through the transmission path where the single-ended signal line S and the second pair of ground wires (G2-1, G2-2) are located is greater than the flow amount of the RF signals flowing through the transmission path where the single-ended signal line S and the first pair of ground wires (G1-1, G1-2) are located.

Figure 2:
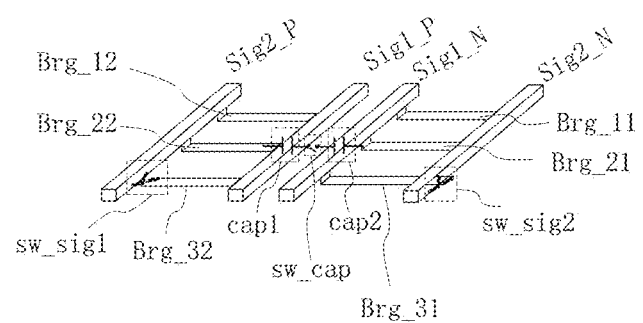
FIG. 2 is a schematic structural diagram illustrating a transmission line phase-shifting unit according to exemplary embodiments of the disclosure.

The following describes a differential transmission line phase-shifting unit as an example of the transmission line phase-shifting unit, an inductance adjusting circuit in the differential transmission line phase-shifting unit includes a switch tube, where the switch tube is used for selecting different groups of transmission lines. For example, as shown in FIG. 2, the inductance adjusting circuit includes at least two switch tubes (sw_sig1, sw_sig2). One switch tube sw_sig1 is connected between the signal line Sig2_P in the second pair of differential transmission lines and the signal line Sig1_P in the first pair of differential transmission lines. The other switch tube sw_sig2 is connected between the signal line Sig2_N in the second pair of differential transmission lines and the signal line Sig1_N in the first pair of differential transmission lines. The signal line Sig2_P and the signal line Sig1_P are both used for transmitting a same RF signal Signal_P in a group of differential RF signals, and the signal line Sig2_N and the signal line Sig1_N are both used for transmitting a same RF signal Signal_N in the group of differential RF signals.

When the phase shifting operation is performed on the input RF signals according to the second phase, the switch tube sw_sig1 and the switch tube sw_sig2 are turned off, so that the RF signals are transmitted via the second pair of differential transmission lines Sig2_P and Sig2_N. When the phase shifting operation is performed on the input RF signals according to the first phase, the switch tube sw_sig1 and the switch tube sw_sig2 are turned on, so that the RF signals are transmitted via the first pair of differential transmission lines Sig1_P and Sig1_N.

The phase adjusting circuit further includes a capacitance adjusting circuit. The capacitance adjusting circuit is configured to adjust capacitance parameters (e.g., capacitance values) of the transmission line phase-shifting unit under the control of at least one input phase shifting control signal so that the transmission line phase-shifting unit selects to perform a phase shifting operation according to the first phase or the second phase. The capacitance adjusting circuit is a controlled circuit that provides an adjustable capacitance, and can be adjusted according to capacitance required by the transmission line phase-shifting unit in a state of the first phase or the second phase (i.e., the first phase state or the second phase state).

The capacitance adjusting circuit provides adjustment based on a variable capacitance circuit. The capacitance adjusting circuit includes, for example, at least one of following controlled circuits: a switched capacitor array, and a variable capacitance circuit including at least one varactor diode. The switched capacitor array includes a plurality of groups of series circuits, each group of series circuits including a switch tube and a capacitor. Each switch tube is selectively turned on or off according to a corresponding input phase shifting control signal. In the variable capacitance circuit including the at least one varactor diode, a capacitance value of each varactor diode is adjusted according to the phase shifting control signal inputted.

In the above variable capacitance circuit, a switched capacitor providing a fixed capacitance value can be optionally included to provide a basic capacitance value for the capacitance adjusting circuit, and other variable capacitance circuits are used for adjusting a total capacitance value based on the basic capacitance value. In the variable capacitance circuit of the above fixed and/or variable capacitance, a switch tube can be optionally included, and the switch tube can be used as an adjustment mechanism according to an input control signal. By adjusting a conduction state of the switch tube, it is possible to enable the switch tube not only to work in the off state and the on state, but also work in a plurality of semi-conduction states between the off state and the on state, which is equivalent to controlling the capacitance value.

Figure 3:
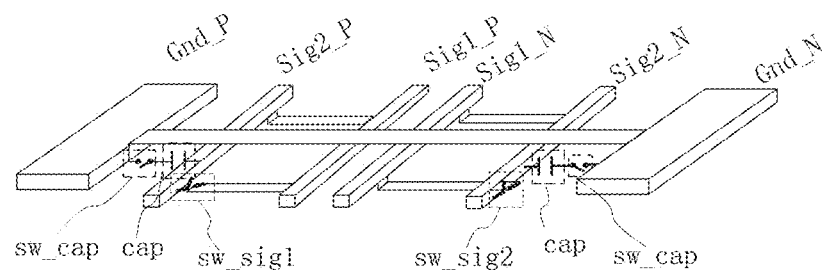
FIG. 3 is a schematic structural diagram illustrating a transmission line phase-shifting unit according to other exemplary embodiments of the disclosure.

The capacitance adjusting circuit can be coupled between a respective transmission line for transmitting RF signals and a corresponding reference ground. As an example, the capacitance adjusting circuit in the single-ended transmission line phase-shifting unit is coupled between the signal line S and any ground wire. As another example, as shown in FIG. 3, the differential transmission line phase-shifting unit further includes a ground wire Gnd_P and a ground wire Gnd_N. A metal is connected between the ground wire Gnd_P and the ground wire Gnd_N to form an equipotential circuit. Each transmission line in a same group of transmission lines is coupled with the ground wire Gnd_P or the ground wire Gnd_N via a corresponding capacitance adjusting circuit. For example, as shown in FIG. 3, the capacitance adjusting circuit includes two groups of series-connected capacitors cap and switch tubes sw_cap, where each capacitor cap and a corresponding switch tube sw_cap in a same group are connected in series. One group of series-connected capacitor cap and switch tube sw_cap is connected between the ground wire Gnd_P and the signal line Sig2_P, and another group of series-connected capacitor cap and switch tube sw_cap is connected between the ground wire Gnd_N and the signal line Sig2_N. In order to make the differential transmission line phase-shifting unit have a symmetrical arrangement to maintain symmetry of differential RF signals, the capacitance adjusting circuit is symmetrically arranged in an integrated circuit.

In order to simplify circuit complexity of the differential transmission line phase-shifting unit and maintain the signal symmetry of the differential signal, so as to facilitate phase shifting and signal transmission by utilizing anti-interference property of the RF signal, the spacing (as shown in FIG. 1B, double d11 (2×d11)) between the first pair of differential transmission lines and a length of each transmission line in the first pair of differential transmission lines are configured according to the inductance parameter and the capacitance parameter that correspond to the first phase.

The following describes the differential transmission line phase-shifting unit as an example. As shown in FIG. 1B and FIG. 2, the capacitance adjusting circuit is connected between the second pair of differential transmission lines (Sip2_P, Sip2_N). The capacitance adjusting circuit includes capacitors cap1 and cap2 that are arranged symmetrically with respect to the virtual axis line and a switch tube sw_cap. One end of the capacitor cap1 is connected to the signal line Sig2_P of the second pair of differential transmission lines and the other end of the capacitor cap1 is connected to the switch tube sw_cap. One end of the capacitor cap2 is connected to the signal line Sig2_N of the second pair of differential transmission lines and the other end of the capacitor cap2 is connected to the switch tube sw_cap. The operating process of the capacitance adjusting circuit is illustrated as follows. For example, under the control of the phase shifting control signal, when the switch tube sw_cap is turned on, the transmission line phase-shifting unit performs a phase shifting operation on the input RF signals according to the second phase. When the switch tube sw_cap is turned off, the transmission line phase-shifting unit performs a phase shifting operation on the input RF signals according to the first phase. For another example, under the control of the phase shifting control signal, when the switch tube sw_cap provides a large resistance value by using semiconductor characteristics, it is equivalent to adjusting shunt configuration of the RF signals in the two pairs of differential transmission lines, so that a current component of the RF signals transmitted through the second pair of differential transmission lines (Sip2_P, Sip2_N) is larger than a current component of the RF signals transmitted through the first pair of differential transmission lines (Sip1_P, Sip1_N). Therefore, the transmission line phase-shifting unit performs the phase shifting operation on the input RF signals according to the second phase. When the switch tube sw_cap provides a small resistance value by using the semiconductor characteristics, it is equivalent to adjusting shunt configuration of the RF signals in the two pairs of differential transmission lines, so that the current component of the RF signals transmitted through the second pair of differential transmission lines (Sip2_P, Sip2_N) is smaller than the current component of the RF signals transmitted through the first pair of differential transmission lines (Sip1_P, Sip1_N). Therefore, the transmission line phase-shifting unit performs the phase shifting operation on the input RF signals according to the first phase.

Each controlled circuit described above may be connected to a corresponding transmission line according to a position relationship between the transmission lines and a position where each circuit device is disposed. For example, in a stacked semiconductor structure, the phase adjusting circuit may be connected to the corresponding transmission line through a metal via hole and/or a conductor such as a microstrip line. In order to systematically suppress jitter, phase-shifting drift, common mode in differential signals, and other aspects of the phase shifter generated when the transmission line phase-shifting unit performs the phase shifting, the transmission line phase-shifting unit further includes multiple bridges. Each bridge may include a microstrip line, or a microstrip line and a metal via hole. All the bridges are symmetrically arranged to symmetrically couple other electrical devices in the phase adjusting circuit to corresponding transmission lines. In this way, the whole symmetric circuit structure of the transmission line phase-shifting unit is realized. For example, as shown in FIG. 2, bridges Brg_11, Brg_21, and Brg_31 are coupled between the signal line Sig1_N and the signal line Sig2_N, and bridges Brg_12, Brg_22, and Brg_32 are coupled between the signal line Sig1_P and signal line Sig2_P. Bridges Brg_11 and Brg_12 are symmetrically arranged with respect to the direction of the signal transmission. Bridges Brg_21 and Brg_22 are symmetrically arranged with respect to the direction of the signal transmission. Bridges Brg_31 and Brg_32 are symmetrically arranged with respect to the direction of the signal transmission. In addition, the bridges Brg_11 and Brg_31 are symmetrically arranged with respect to the bridge Brg_21, and the bridges Brg_12 and Brg_32 are symmetrically arranged with respect to the bridge Brg_22. The capacitance adjusting circuit and the inductance adjusting circuit each are symmetrically connected to the bridges, to realize the whole axisymmetric circuit structure of the transmission line phase-shifting unit.

In some examples not shown, some electrical devices in the capacitance adjusting circuit and the inductance adjusting circuit can be coupled to different connection points of a same bridge to reduce the number of bridges, thereby simplifying the circuit structure and improving the overall circuit stability of the transmission line phase-shifting unit.

In some embodiments, in order to reduce interference of the electromagnetic radiation of the differential transmission line phase-shifting unit on signals of other circuits in the integrated circuit, for example, to reduce the interference of the electromagnetic radiation on a signal of a low frequency circuit, the transmission line phase-shifting unit further includes a grounding conductor disposed around the first pair of differential transmission lines and the second pair of differential transmission lines. The grounding conductor is configured to provide electromagnetic shielding of the differential transmission line phase-shifting unit. The grounding conductor can be omitted or retained.

Figure 4:
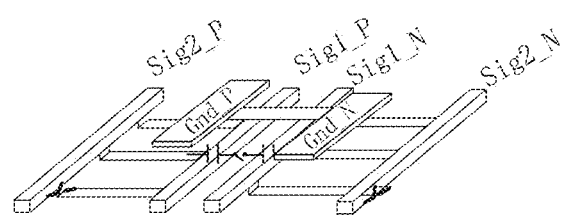
FIG. 4 is a schematic structural diagram illustrating a transmission line phase-shifting unit according to other exemplary embodiments of the disclosure.

In some examples, the grounding conductor is located at least on a metal layer between the transmission line phase-shifting unit and other circuits according to a position relationship between the transmission line phase-shifting unit and the other circuits. For example, a grounding conductor in a shape of a grounding metal strip is formed on the metal layer. There are a plurality of grounding metal strips, which are arranged as a grounding conductor including grid-shaped strips arranged at intervals. For example, the grounding conductor is formed on the metal layer between the differential transmission line phase-shifting unit and the other circuits, and the grounding conductor is also symmetrical in structure to effectively shield electromagnetic radiation. As shown in FIG. 3 or FIG. 4, the grounding conductor includes the ground wires Gnd_P and Gnd_N and the metal wire connected between the ground wires. As shown in FIG. 3, an envelope size of the grounding conductor is larger than an envelope size of the transmission line phase-shifting unit, e.g., each of the ground wires Gnd_P and Gnd_N in the grounding conductor is disposed on a corresponding signal line of the second pair of transmission lines (Sig2_P and Sig2_N) away from a respective signal line of the first pair of transmission lines (Sig1_P and Sig1_N). Alternatively, as shown in FIG. 4, the envelope size of the grounding conductor is smaller than the envelope size of the transmission line phase-shifting unit, e.g., the grounding conductor is disposed between the second pair of transmission lines (Sig2_P and Sig2_N).

In other examples, the grounding conductor is formed by using a metal layer between the transmission line phase-shifting unit and a package structure of the integrated circuit.

In still other examples, a three-dimensional grounding conductor is formed using a metal layer around each of the transmission line phase-shifting units and a grounding via hole between corresponding metal layers for accommodating a transmission line phase shifter.

The transmission line phase shifter includes a plurality of transmission line phase-shifting units. At least one group of transmission lines of the plurality of transmission line phase-shifting units are coupled with each other to form a cascaded circuit. The cascaded transmission line phase-shifting units can provide a same phase shifting amount or different phase shifting amounts. A state in which each of all the transmission line phase-shifting units in the transmission line phase shifter is in a respective first phase state is called as a reference state of the transmission line phase shifter, and a state in which each of all the transmission line phase-shifting units is in a respective second phase state is called as a phase shifting state. For example, a first phase and a second phase of each of the cascaded transmission line phase-shifting units are respectively identical with a first phase and a second phase of any other transmission line phase-shifting unit according to a predetermined phase shifting step of the radar sensor. In addition, each of the transmission line phase-shifting units can be individually controlled by a corresponding phase shifting control signal so that the transmission line phase shifter can provide a phase shifting operation of an integral multiple of the phase shifting step. The phase shifting step is a phase shifting amount $\Delta\varphi$ of a single transmission line phase-shifting unit in the transmission line phase shifter.

The transmission line phase-shifting units are electrically coupled with each other through at least one group of transmission lines in each transmission line phase-shifting unit to form a cascaded circuit. For example, in the radar sensor, a single-ended signal line S, a first pair of ground wires (G1-1 and G1-2), and a second pair of ground wires (G2-1 and G2-2) in each of a plurality of single-ended transmission line phase-shifting units are metal wires that are integrally manufactured. Each transmission line phase-shifting unit utilizes a corresponding phase adjusting circuit to provide a phase shifting operation. As another example, in the radar sensor, the single-ended signal line S and the second pair of ground wires (G2-1 and G2-2) in each of the plurality of single-ended transmission line phase-shifting units are metal wires that are integrally manufactured. Each transmission line phase-shifting unit utilizes a corresponding phase adjusting circuit to enable RF signals to be transmitted along different groups of transmission lines, so as to provide a phase shifting operation.

For the RF signal, due to the electromagnetic characteristics of the RF signal and a relatively long total length of each transmission line in the transmission line phase shifter, a total phase shifting amount and a phase shifting deviation of the transmission line phase shifter are restricted by each other. When the number of transmission line phase-shifting units in the transmission line phase shifter is relatively large, the total phase shifting amount of the whole transmission line phase shifter is relatively large. However, in this case, since the transmission line has a relatively long length, the electromagnetic radiation generated by the long transmission line when transmitting the RF signal is easy to cause nonlinear phase shifting deviation of the whole transmission line phase shifter.

Therefore, for the two pairs of transmission lines for phase shifting in the transmission line phase-shifting unit, after the cascaded circuit is formed, first pairs of transmission lines in any two transmission line phase-shifting units are physically isolated and any two transmission line phase-shifting units are coupled with each other through a respective second pair of transmission lines.

Each pair of transmission lines for phase shifting are transmission lines in a same group of transmission lines in foregoing examples. For example, the second pair of ground wires (G2-1 and G2-2) for phase shifting in the single-ended transmission line phase-shifting unit are a portion of transmission lines in a same group of transmission lines (S, G2-1, and G2-2). For another example, the second pair of differential transmission lines (Sig2_P and Sig2_N) for phase shifting in the differential transmission line phase-shifting unit are one group of transmission lines (Sig2_P, Sig2_N).

In some examples, the first pair of transmission lines of the respective transmission line phase-shifting unit are arranged between the second pair of transmission lines. That is, the spacing between the first pair of transmission lines is smaller than the spacing between the second pair of transmission lines. Therefore, the first pairs of transmission lines each having a smaller spacing in a respective transmission line phase-shifting unit are physically isolated (i.e., physical isolation is formed between the first pairs of transmission lines in the transmission line phase-shifting units), and the second pairs of transmission lines each having a larger spacing in the respective transmission line phase-shifting unit are electrically connected (i.e., electrical connection is formed between the second pairs of transmission lines in the transmission line phase-shifting units).

Figure 5A:
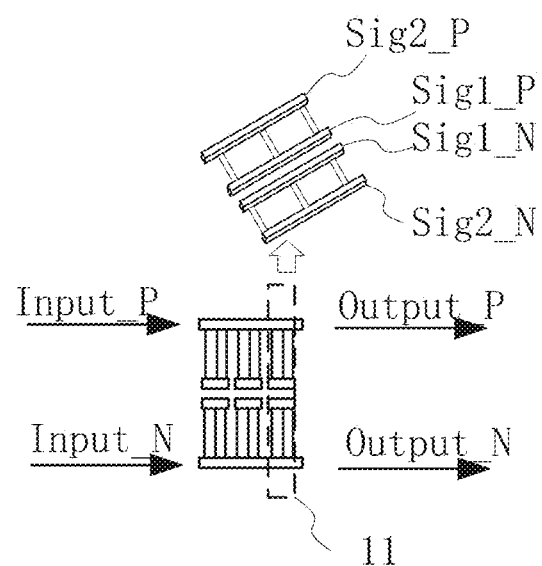
FIGS. 5A and 5B are schematic structural diagrams illustrating a transmission line phase shifter according to exemplary embodiments of the disclosure.
Figure 5B:
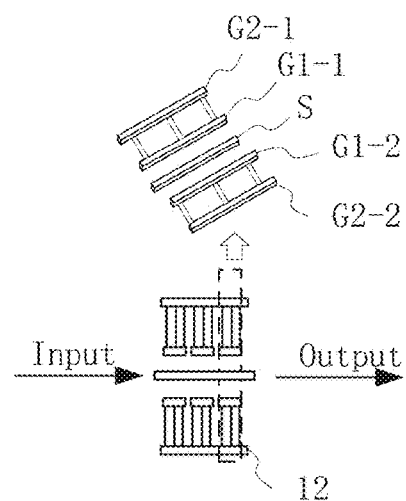

The physical isolation involves a shielding structure for electromagnetic isolation, or is a gap defined between transmission lines of the transmission line phase-shifting units, etc. The shielding structure is a structure where no current transmission is formed between the transmission lines. For example, the shielding structure is protrusions or holes formed between the transmission lines by an insulating medium; or metal via holes defined on the transmission lines so that RF signals cannot be transmitted by current. The gap is defined between physically disconnected transmission lines and can be filled with an insulating medium such as plastic or air to achieve non-current transmission. As shown in FIG. 5A, differential transmission line phase-shifting units 11 are cascaded to form the transmission line phase shifter. Differential RF signals Input_P and Input_N are input signals, and differential RF signals Output_P and Output_N are output signals that are respectively a RF signal Input_N subjected to phase shifting and a RF signal Input_P subjected to phase shifting. The second pair of differential transmission lines (Sig2_P and Sig2_N) of each of the cascaded transmission line phase-shifting units 11 integrally form a metal line, and the first pairs of differential transmission lines (Sig1_P and Sig1_N) of the cascaded transmission line phase-shifting units 11 are physically disconnected to define gaps. As also shown in FIG. 5B, single-ended transmission line phase-shifting units 12 are cascaded to form a transmission line phase shifter. A single-ended RF signal Input is an input signal and a single-ended RF signal Output is an output signal that is a single-ended RF signal subjected to phase shifting. The second pair of ground wires (G2-2 and G2-1) of each of the cascaded transmission line phase-shifting units 12 integrally form a metal line and a single-ended signal line S of each of the cascaded transmission line phase-shifting units 12 integrally form another metal line. The first pairs of ground wires (G1-2 and G1-1) of the cascaded transmission line phase-shifting units 12 are physically disconnected to define gaps.

The physical isolation between different pairs of transmission lines each having a relatively small spacing is beneficial to avoid generating accumulated electromagnetic interference when the transmission line phase shifter performs a phase shifting operation with a small phase shift. In this case, it is beneficial to improve linearity and accuracy of the phase shifting of the transmission line phase shifter, and greatly reduce the calibration difficulty of the transmission line phase shifter.

The transmission line phase shifter may be individually configured in the RF circuit to provide phase shifting in a phase shifting step. Alternatively, the transmission line phase shifter is cascaded with other types of phase shifters to form a phase shifting system.

Embodiments of the disclosure further provide a phase shifting system. The phase shifting system includes transmission line phase shifters and a phase shifting controller coupled with a phase adjusting circuit of each of the transmission line phase shifters.

In order to utilize the phase shifting amount $\Delta\varphi = \varphi_2 - \varphi_1$ of each transmission line phase-shifting unit to provide multi-stage phase shifting operation in a range of 360°, in some examples, the phase shifting system may include)((360°/$\Delta\varphi$) transmission line phase-shifting units cascaded. For a radar chip including integrated circuits with high size requirements, the above phase shifting system is difficult to adapt to the size limitation of the radar chip, and increases the loss of the RF signals. Therefore, the disclosure provides a phase shifting system. The phase shifting system includes a RF inverter and a transmission line phase shifter. The transmission line phase shifter includes a plurality of transmission line phase-shifting units. The RF inverter and the transmission line phase-shifting units are cascaded. The RF inverter can be connected to any cascaded position of the cascaded transmission line phase-shifting units (cascaded circuit). For example, the RF inverter is located at the first or last stage of the cascaded circuit to facilitate minimizing sporadic control of the transmission line phase-shifting units adjusting multiple phase states.

The RF inverter is a RF device that is controlled to perform in-phase or inverting phase shifting. The RF inverter can be a single-ended RF inverter or a differential RF inverter. For the arrangement of the integrated circuits, asymmetry arrangement caused by cross-layer and device connection is easy to occur in the circuit structure of the RF inverter, which may lead to deviation of each of phases of differential signals or a phase of a single-ended signal outputted from the RF inverter when the conversion and inverting phase shifting of the single-ended signal and the differential signals are simultaneously performed, thereby affecting the phase-shifting accuracy of the whole phase-shifting system.

In order to solve above problems with a simplified circuit structure, the disclosure provides a RF inverter capable of realizing single-ended and differential signal conversion. The RF inverter includes an inductance circuit and a phase adjusting circuit, both of which are arranged symmetrically along a same symmetry axis. The symmetry axis is used for indicating that a circuit structure of the entire RF inverter is substantially symmetrical. For example, the symmetry axis is not a physical object and just used for indicating that the circuit structure of the RF inverter is a symmetric structure. As another example, the symmetry axis is a line along a tap line in the inductance circuit.

Figure 6:
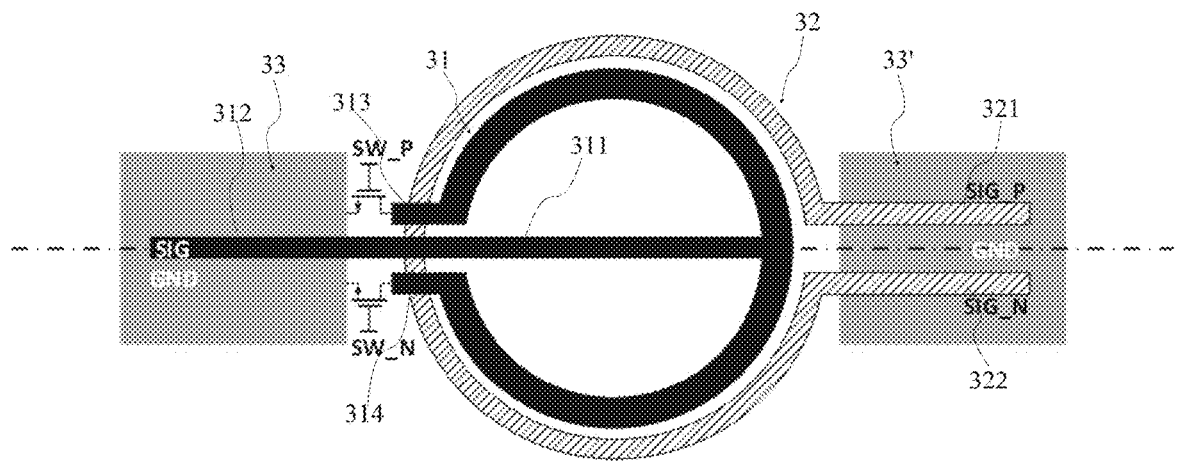
FIG. 6 is a schematic structural diagram illustrating a RF inverter according to exemplary embodiments of the disclosure.

The inductance circuit includes a single-ended signal interface and a differential signal interface. The single-ended signal interface (or differential signal interface) is cascaded with a corresponding transmission line phase shifter or LO circuit. The single-ended signal interface includes a single-ended signal terminal SIG and a pair of ground terminals (Gnd_A and Gnd_B). For example, as illustrated in FIG. 6, the ground terminal Gnd_A is marked as 313, and the ground terminal Gnd_B is marked as 314. The differential signal interface includes a pair of differential signal terminals (Sig_P and Sig_N). For example, as illustrated in FIG. 6, the differential signal terminal Sig_P is marked as 321 and the differential signal terminal Sig_N is marked as 322. The single-ended signal interface and the differential signal interface both are symmetrically arranged in the circuit structure of the RF inverter along the symmetry axis.

The phase adjusting circuit of the RF inverter includes two controlled switches. Each controlled switch is connected between a ground wire and a corresponding ground terminal in the single-ended signal interface (for example, a controlled switch SW_P is connected between a ground wire 33 and a ground terminal Gnd_A, and a controlled switch SW_N is connected between the ground wire 33 and a ground terminal Gnd_B), so that the inductance circuit outputs a RF signal of in-phase or reverse phase (in-phase and inverting RF signal). In other words, the inductance circuit performs in-phase and inverting phase shifting on the input RF signal. In addition, the two controlled switches are symmetrical with respect to the symmetry axis in the layout arrangement of the integrated circuit. Since the RF inverter is a symmetrical circuit structure, both the in-phase and inverting phase shifting of the RF inverter have a relatively small phase error.

Therefore, the inductance circuit is a symmetrical circuit structure along the symmetrical axis. The inductance circuit includes a first inductor providing the single-ended signal interface and a second inductor providing the differential signal interface. The first inductor and the second inductor provide conversion between a single-ended RF signal and a differential RF signal through inductive coupling. In an axisymmetric circuit layout, the first inductor and the second inductor may be arranged on a same metal layer or different metal layers of the integrated circuit, or have a same wiring shape or different wiring shapes. The wiring shape is, for example, a circle, an ellipse, a rectangle, or a polygon (such as a pentagon or a hexagon), or the like.

Referring to FIG. 6, the inductance circuit includes a first inductor 31 that is symmetrical along a tap line 311, where the tap line 311 is coupled with a signal terminal 312 in the single-ended signal interface. The inductance circuit further includes a second inductor 32 coupled to the first inductor 31, and the second inductor 32 is also symmetrical along the tap line 311, and has a differential signal interface including differential transmission terminals (321, 322). A pair of ground terminals (313, 314) of the first inductor 31 are respectively connected to a pair of controlled switches (SW_P, SW_N) in a phase adjusting circuit of the RF inverter, where the pair of ground terminals (313, 314) are symmetrical with respect to the tap line 311 (i.e., the symmetry axis). A ground wire 33 is disposed on a side of the single-ended signal interface of the first inductor 31 and a ground wire 33' is disposed on a side of the differential signal interface of the second inductor 32. The ground wire 33 on the side of the single-ended signal interface is symmetrical about the symmetry axis such that the pair of controlled switches (SW_P, SW_N) are connected between the ground terminals (313, 314) and the ground wire 33 in a symmetrical circuit layout manner. The ground wire 33' on the side of the differential signal interface may also be symmetrical about the symmetrical axis for easy machining. The first inductor 31 and the second inductor 32 shown in FIG. 6 may be disposed on different metal layers, or disposed on a same metal layer but insulated at an overlapping portion between the first inductor 31 and the second inductor 32.

Figure 7A:
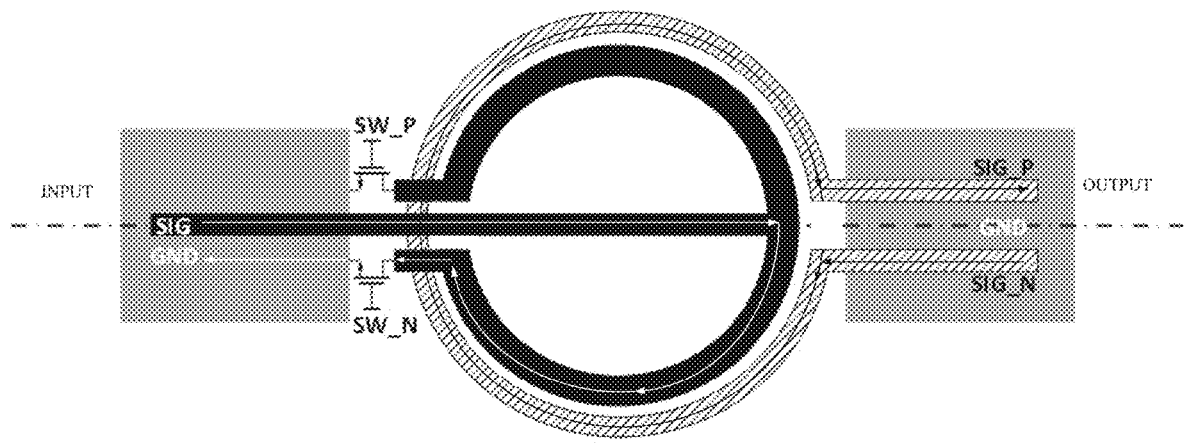
FIGS. 7A, 7B, 7C, 7D are schematic diagrams illustrating signal transmission in RF inverters according to exemplary embodiments of the disclosure.
Figure 7B:
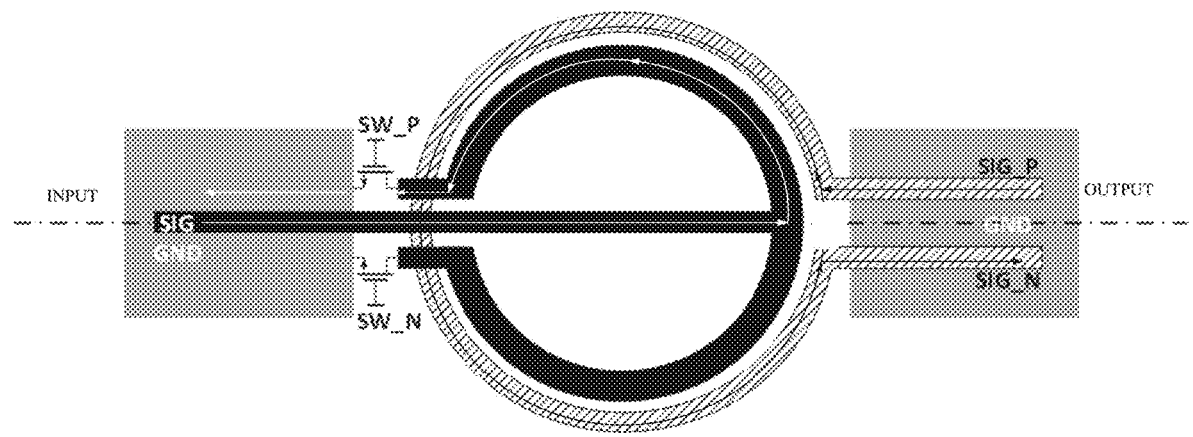

In one example, the single-ended signal interface is used as a RF signal input terminal, and the differential signal interface is used as a RF signal output terminal. Under the control of the phase shifting control signal, when the controlled switch SW_P is turned off and the controlled switch SW_N is turned on, as shown in FIG. 7a, the RF inverter performs a phase shifting operation with a phase shift of 0° on a single-ended RF signal input from the single-ended signal interface to output an in-phase RF signal. When the controlled switch SW_P is turned on and the controlled switch SW_N is turned off, as shown in FIG. 7B, the RF inverter performs a phase shifting operation with a phase shift of 180° on the single-ended RF signal input from the single-ended signal interface to output an inverted RF signal.

Figure 7C:
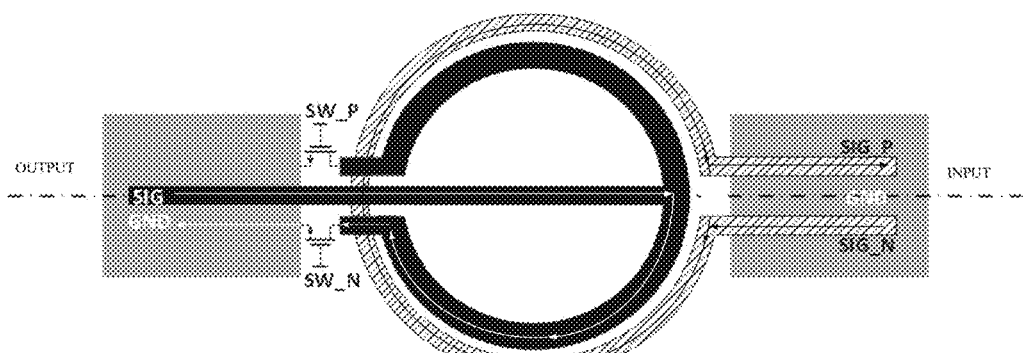
Figure 7D:
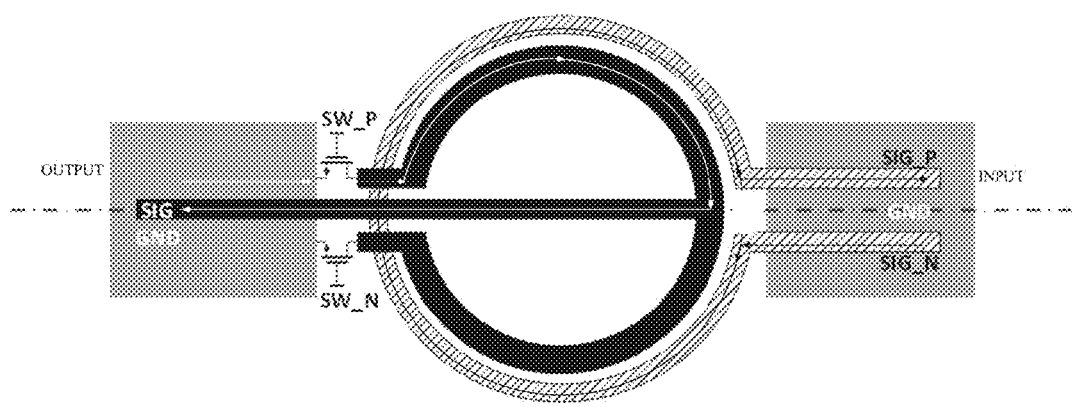

In another example, the differential signal interface is used as the RF signal input terminal and the single-ended signal interface is used as the RF signal output terminal. Under the control of the phase shifting control signal, when the controlled switch SW_P is turned off and the controlled switch SW_N is turned on, as shown in FIG. 7C, the RF inverter performs phase shifting of 0° on RF signals input from the differential signal interface to output a single-ended RF signal. When the controlled switch SW_P is turned on and the controlled switch SW_N is turned off, as shown in FIG. 7D, the RF inverter performs phase shifting of 180° on the RF signals input from the differential signal interface to output a single-ended RF signal with an opposite phase as the single-ended RF signal as shown in FIG. 7C.

Figure 8A:
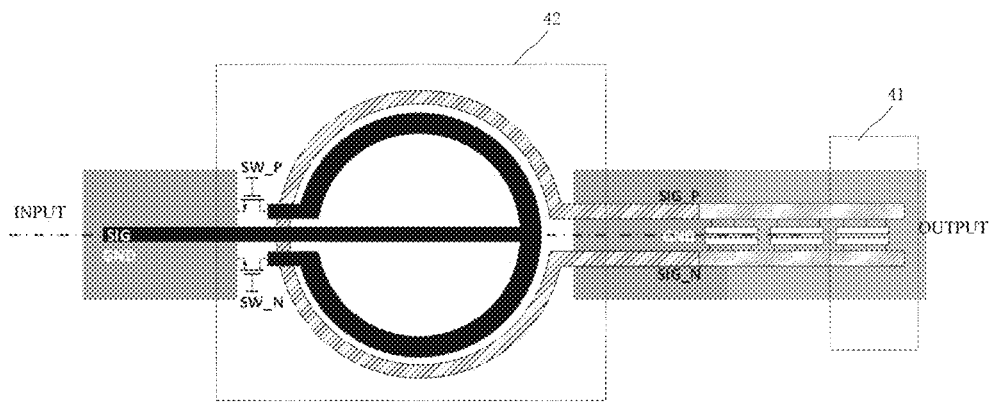
FIGS. 8A and 8B are schematic structural diagrams illustrating a phase shifting system according to exemplary embodiments of the disclosure.

In a phase shifting system illustrated in FIG. 8A, the single-ended signal interface of the RF inverter 42 is connected to a LO circuit (not shown) in a radar sensor, and the differential signal interface of the RF inverter 42 is connected to a plurality of differential transmission line phase-shifting units 41 cascaded. The first pair of differential transmission lines which are relatively close to each other in each transmission line phase-shifting unit 41 are physically isolated from the first pair of differential transmission lines which are relatively close to each other in any other transmission line phase-shifting units 41. The second pairs of differential transmission lines in the transmission line phase-shifting units 41 are electrically connected to each other and each of the second pairs of differential transmission lines are respectively connected to differential transmission lines or differential signal terminals (SIG_P, SIG_N) in the differential signal interface of the RF inverter 42. A ground wire of each transmission line phase-shifting unit 41 is connected to a ground wire GND on the side of the differential signal interface of the RF inverter 42.

Figure 8B:
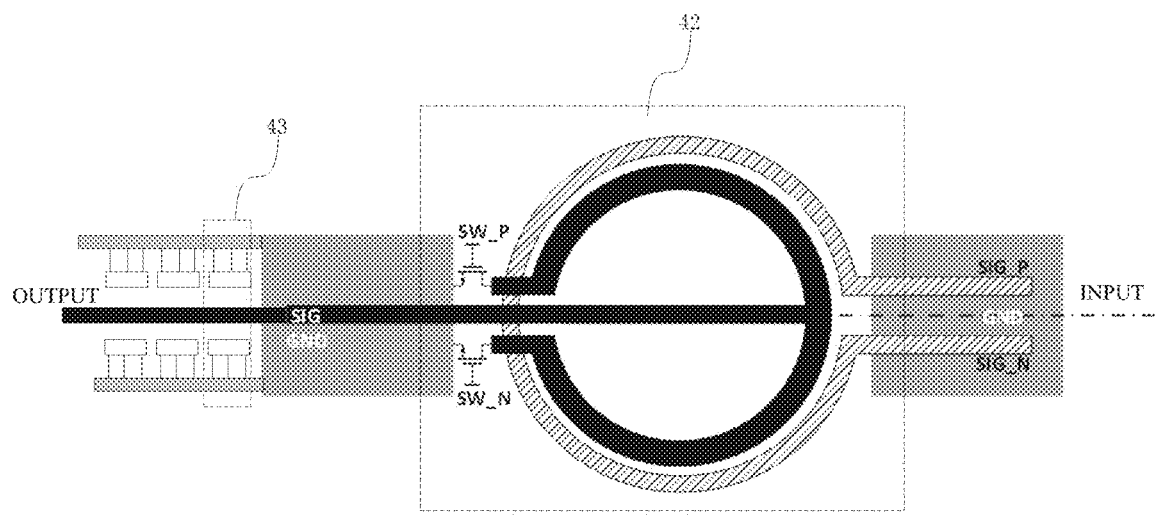

In a phase shifting system illustrated in FIG. 8B, the differential signal interface of the RF inverter 42 is connected to the LO circuit (not shown) in the radar sensor, and the single-ended signal interface of the RF inverter 42 is connected to a plurality of single-ended transmission line phase-shifting units 43 that are cascaded. The first pair of ground wires which are relatively close to each other in each transmission line phase-shifting unit 43 are physically isolated from the first pair of ground wires which are relatively close to each other in any other transmission line phase-shifting unit 43. The second pairs of ground wires in the transmission line phase-shifting units 43 are electrically connected to each other, and each of the second pairs of ground wires are connected to a ground wire of the RF inverter 42. A single-ended signal line in a respective transmission line phase-shifting unit 43 of the transmission line phase-shifting units 43 cascaded is connected to a single-ended signal terminal SIG in the single-ended signal interface of the RF inverter 42. A ground wire of each transmission line phase-shifting unit 43 is connected to a ground wire GND on the side of the single-ended signal interface of the RF inverter 42.

As illustrated in FIGS. 8A and 8B, in the phase shifting system including the RF inverter and the transmission line phase shifter, since the transmission line phase shifter can provide, under the control of a corresponding phase shifting control signal, a phase shifting operation multiple times with an unit phase shifting step as a phase shifting step so as to provide phase shifting in a range of 0° to 180°, and the RF inverter can perform, under the control of the phase shifting control signal, inverting phase shifting in a range of 180°, it is possible to realize that the whole phase shifting system can provide a high-precision phase-shifting operation in a range of 0° to 360° and effectively reduce the overall size of the phase shifting system in the integrated circuit.

The RF inverter and the transmission line phase-shifting units in the above examples are all passive devices. During operating, the RF inverter and the transmission line phase-shifting units in the above examples are less affected by changes in external environment and voltages, so that a phase shifting error is smaller than a phase shifting error of an active device such as the IQ phase shifter. However, when the transmission line phase-shifting units are cascaded, accumulated errors may relatively large. Therefore, the phase shifting system of the disclosure can also provide calibration. To this end, the phase shifting system may include a transmission line phase shifter including a calibration circuit, or include a transmission line phase shifter including a calibration circuit and a RF inverter that are cascaded.

Since the phase shifting system generally generates electromagnetic radiation, the signal interface of the RF inverter is connected to the second group of transmission lines of each transmission line phase-shifting unit and is physically isolated from at least a portion of transmission lines of the first groups of transmission lines.

For example, the differential signal interface is connected to each second pair of differential transmission lines in the differential transmission line phase shifter, and the differential signal interface is physically isolated from each first pair of differential transmission lines in the differential transmission line phase shifter. Continuing to referring to FIG. 8A, differential signal terminals (SIG_P, SIG_N) in the differential signal interface of the RF inverter are respectively connected to each second pair of differential transmission lines (Sig2_P, Sig2_N) arranged on an outer side of the differential transmission line phase shifter, and the differential signal interface of the RF inverter is physically isolated from each first pair of differential transmission lines (Sig1_P, Sig1_N) arranged on an inner side of the differential transmission line phase shifter.

The single-ended signal interface is connected to a pair of ground wires in one group of transmission lines of each transmission line phase-shifting unit in the single-ended transmission line phase shifter, and the single-ended signal interface is physically isolated from a pair of ground wires in another group of transmission lines of each transmission line phase-shifting unit in the single-ended transmission line phase shifter. Still referring to FIG. 8B, the signal terminal SIG in the single-ended signal interface of the RF inverter is coupled with a single-ended signal line S of each transmission line phase-shifting unit in the single-ended transmission line phase shifter, the ground terminals GND in the single-ended signal interface of the RF inverter are respectively coupled with a pair of ground wires (G2-1, G2-2) on an outer side of each transmission line phase-shifting unit in the single-ended transmission line phase shifter, and the single-ended signal interface is physically isolated from another pair of ground wires (G1-1, G1-2) on an inner side of each transmission line phase-shifting unit in the single-ended transmission line phase shifter.

An inductance and/or capacitance adjusting circuit of each transmission line phase-shifting unit in the transmission line phase shifter further include at least one calibration mechanism. Since there are some engineering errors (such as design deviation, semiconductor processing deviation, temperature change, voltage change, process angle change, etc.), the capacitance parameters C1, C2 and the inductance parameters L1, L2 of the transmission line phase-shifting unit (including the transmission lines and the controlled circuits) are deviated from a capacitance parameter and inductance parameter corresponding to a target phase shifting amount, which makes a phase shifting function $\varphi_1=\omega(\sqrt{L_1C_1})$ in the first phase state and a phase shifting function $\varphi_2=\omega(\sqrt{L_2C_2})$ in the second phase states deviate. Therefore, there is deviation between a phase shifting amount $\Delta\varphi=\varphi_2-\varphi_1$ of the phase shifter and the target phase shifting amount. In order to correct these deviations, the transmission line phase-shifting unit needs to have a calibration mechanism.

The principle of the calibration mechanism of the transmission line phase shifter is that by adjusting the performance of capacitance and/or inductance adjusting circuit, values of some or all electrical parameters C1, C2, L1, and L2 of the circuit are adjusted within a certain range, so that the actual phase shifting amount $\Delta\varphi$ of the transmission line phase-shifting unit can be adjusted to the target phase shifting amount.

Each transmission line phase-shifting unit in the transmission line phase shifter is controlled by at least one channel of corresponding phase shifting control signal to compensate a phase shifting error of each phase shifting amount provided by the transmission line phase shifter. Therefore, a phase shifting control signal input to each transmission line phase-shifting unit is determined according to phase calibration information corresponding to the first phase or the second phase. The phase calibration information is information for indicating that an actual phase shifting amount after calibration of a RF signal output from a calibrated phase shifting system in a non-calibrated state (such as an operating state) is closer to a preset phase shifting amount than a phase shifting amount before calibration. The phase calibration information is, for example, a phase deviation between the actual phase shifting amount after calibration and the phase shifting amount before calibration of the phase shifting system (or the transmission line phase shifter of the phase shifting system), or compensation information determined according to the phase deviation.

The compensation information is determined according to calibration strategies set by testing the transmission line phase shifter multiple times. The calibration strategies include but are not limited to at least one of the following: influence of phase shifting changes of the transmission line phase shifter (or individual transmission line phase-shifting unit) in different phase shifting amounts on the phase shifting, influence of temperature on the phase shifting of the transmission line phase shifter (or individual transmission line phase-shifting unit), or influence of a systematic error of the transmission line phase shifter (or individual transmission line phase-shifting unit) on the phase shifting, etc. The compensation information includes, for example, at least one compensation electrical parameter determined corresponding to a phase-shifting phase based on the determined phase deviation. The at least one compensation electrical parameter includes a compensation voltage, a compensation duty cycle, or a compensation current. Adjustable electrical parameters contained in the phase shifting control signal correspond to compensation electrical parameters. For example, a calibration circuit of the transmission line phase shifter (or individual transmission line phase-shifting unit) respectively calculates compensation information corresponding to each transmission line phase-shifting unit according to a minimum value or a maximum value of preset total phase shifting amounts, or an unit phase shifting amount, and stores the compensation information corresponding to each transmission line phase-shifting unit. The compensation information further includes, for example, any other phase shifting amounts between any two phase shifting amounts and other compensation information corresponding thereto that are determined according to the any two phase shifting amounts and a phase deviation obtained by the calibration circuit.

In some examples, each transmission line phase-shifting unit cascaded in the transmission line phase shifter includes the first phase state and the second phase state, when it is considered that the difficulty of machining, stability of the phase shifting, accuracy of the phase shifting, and other factors. In this way, the transmission line phase shifter is not only a passive device that is easy to manufacture, but also can effectively reduce nonlinear deviation of the phase shifting, which makes calibration of the calibration circuit of the transmission line phase shifter more convenient and faster.

In relation to calibration requirements of the integrated circuit where the transmission line phase shifter is located, the following describes the radar sensor including the transmission line phase shifter as an example. The radar sensor has a calibration state and an operating state. In the calibration state, the radar sensor performs a calibration operation on at least one circuit including the transmission line phase shifter. In the operating state, the radar sensor performs at least one signal measurement processing operation including receiving and transmitting electromagnetic waves and performing signal processing according to a valid interval of the electromagnetic waves. In some examples, the calibration state and the operating state that are different states are switched in different times. In other examples, the calibration circuit operates over a time period during which the radar sensor is in the operating state to reduce time and signal resources for the calibration.

During calibration, the transmission line phase shifter performs a phase shifting operation on an input RF signal according to any total phase shifting amount $Ø_1$ (such as a minimum value of the preset total phase shifting amounts), and outputs a RF signal RF_1 that is an input RF signal subjected to phase shifting. The calibration circuit obtains the RF signal RF_1 corresponding to the phase shifting amount $Ø_1$, and calculates a phase deviation $\Delta Ø_1$ between an actual phase shifting amount $Ø'_1$ of the RF signal RF_1 and the preset phase shifting amount $Ø_1$. In addition, the phase shifting system performs another phase shifting operation on the input RF signal according to another total phase shifting amount $Ø_2$ (such as a maximum value of the preset total phase shifting amounts), and outputs a RF signal RF_2 that is an input RF signal subjected to phase shifting. The calibration circuit obtains the RF signal RF_2 corresponding to the phase shifting amount $Ø_2$, and calculates a phase deviation $\Delta Ø_2$ between an actual phase shifting amount $Ø'_2$ of the RF signal RF_2 and the preset phase shifting amount $Ø_2$. According to the number of cascaded transmission line phase-shifting units participating in calibration, and feature of linearly accumulation of phase-shifting errors of the transmission line phase-shifting units, the calibration circuit carries out equal-division processing on obtained two phase deviations respectively, so as to obtain a phase deviation of each transmission line phase-shifting unit corresponding to the first phase and another phase deviation of each transmission line phase-shifting unit corresponding to the second phase.

In order to ensure high reliability of measurement information provided by the radar sensor, especially for a vehicle-mounted radar sensor, the radar sensor further includes a built-in self-test (BIST) system. The calibration circuit described above can be configured in the BIST system, to detect a phase deviation of the transmission line phase shifter in the calibration state. If the phase deviation is within a calibrable range, the calibration circuit can be used to determine and store the phase calibration information save.

Different from a manner of calibrating phase shifting amounts one by one (single-point calibration) in the IQ phase shifter, the transmission line phase shifter in implementations of the disclosure includes cascaded transmission line phase-shifting units, and each transmission line phase-shifting unit has better phase shifting linearity. Therefore, the calibration circuit detects a phase deviation of the phase shifting system that performs the phase shifting on the RF signal by controlling each transmission line phase-shifting unit in the transmission line phase shifter to be in the first phase state or the second phase state, so as to obtain the phase deviation of each transmission line phase-shifting unit and then obtain the phase calibration information.

Figure 11:
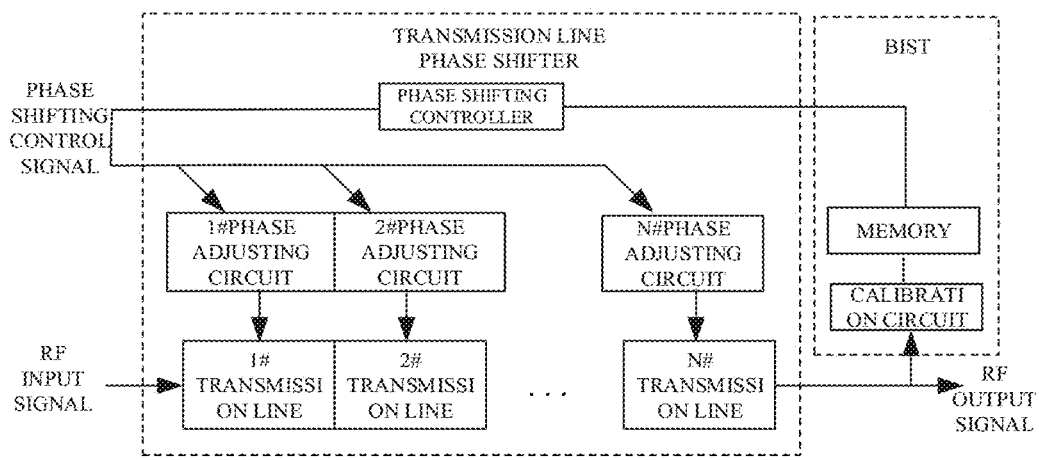
FIG. 11 is a schematic structural diagram illustrating a phase shifting system.
Figure 12A:
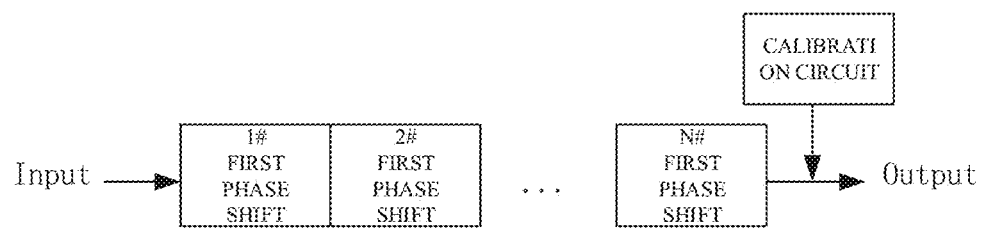
FIGS. 12A and 12B are schematic diagrams illustrating operating states of a calibration circuit according to exemplary embodiments of the disclosure.
Figure 12B:
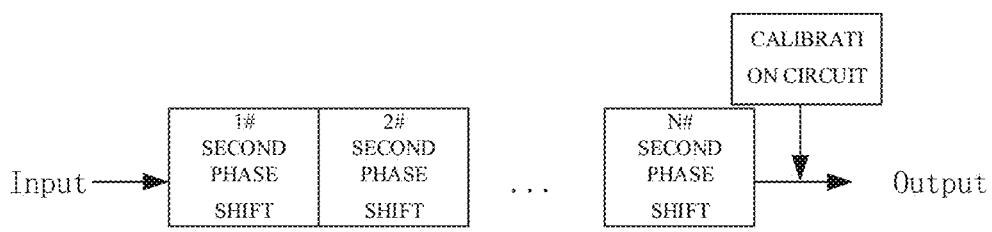

Therefore, as illustrated in FIG. 11, the phase shifting system provided in the disclosure includes a calibration circuit and a transmission line phase shifter. The specific calibration operations of the calibration circuit are as follows. As shown in FIG. 12A, the transmission line phase shifter includes N cascaded transmission line phase-shifting units (1 #, 2 #, N #). As shown in FIG. 12A, all the N transmission line phase-shifting units are configured in the first phase state before calibration, and at an output terminal of the transmission line phase shifter (i.e., output in the figure), the calibration circuit detects and obtains a phase of an output signal (relative to a reference signal with a same frequency) and records the phase of the output signal as $Ø_1$ (i.e., $Ø_1$ is a phase shift between the output signal and the reference signal). As shown in FIG. 12B, all the N transmission line phase-shifting units are configured in the second phase state before calibration, and the calibration circuit detects and obtains a phase of an output signal of the transmission line phase shifter and records the phase of the output signal as $Ø_2$. Thereafter, a total phase shifting amount before calibration of the transmission line phase shifter is $\Delta Ø = Ø_2 - Ø_1$. Since the total phase shifting amount of the transmission line phase shifter is accumulated phase shifting amounts of all the N transmission line phase-shifting units and all the N transmission line phase-shifting units have a same phase shifting amount, the phase shifting amount before calibration of each transmission line phase-shifting unit is $\Delta\varphi=\varphi_2-\varphi_1=\Delta\emptyset/N$, that is, $\Delta\varphi$ is a phase shifting step. The calibration circuit can determine the total phase shifting amount before calibration of the transmission line phase shifter, and equally divide the total phase shifting amount before calibration, so as to obtain a phase shifting step before calibration of each transmission line phase-shifting unit, such that the phase shifting step before calibration of the transmission line phase-shifting unit can be calibrated to a target value (e.g., 5.625°).

In some examples, the calibration circuit converts a target value obtained corresponding to each of the transmission line phase-shifting units into phase calibration information corresponding to a phase shifting amount after calibration of each of the transmission line phase-shifting units in the first phase state or the second phase state according to a mapping relationship between preset electrical parameters and phase shifting amounts, and stores the phase calibration information in a memory. When the phase shifting system operates, fixed electrical parameters are taken as parameters corresponding to the first phase state, and electrical parameters after calibration corresponding to the second phase state is calculated according to the phase calibration information.

In other examples, the calibration circuit uses the total phase deviation $\emptyset_1$ and the total phase deviation $\emptyset_2$ before calibration in different phase states to determine a phase deviation ($\emptyset_1/N$ or $\emptyset_2/N$) before calibration of each transmission line phase-shifting unit in any phase state. The phase deviation is indicative of a phase shifting error corresponding to a phase shifting amount of each transmission line phase-shifting unit in any phase state. In addition, the calibration circuit converts the phase deviation of each transmission line phase-shifting unit into phase calibration information according to a mapping relationship between preset electrical parameters (equivalent inductances and equivalent capacitances) and insertion phases and stores the phase calibration information corresponding to each transmission line phase-shifting unit in the memory. When the phase shifting system operates, a corresponding phase shifting control signal is generated according to phase calibration information corresponding to different phase shifting states.

Therefore, the calibration circuit includes an analog circuit and a digital circuit. The analog circuit includes a phase collection circuit. The phase collection circuit is configured to convert a RF signal into a baseband signal. The digital circuit includes a phase calibration circuit. The phase calibration circuit is configured to detect a phase deviation of the baseband signal.

The phase collection circuit is configured to collect a RF signal output from M transmission line phase-shifting units in the phase shifting system, and perform down-conversion processing on the RF signal collected to obtain a baseband signal. The baseband signal carries an actual phase before calibration of the RF signal. The baseband signal is converted into a baseband digital signal by an analog-to-digital (ADC) converter in the phase calibration circuit, and a first phase (or second phase) after calibration of each transmission line phase-shifting unit is obtained according to a deviation between the actual phase in a frequency domain and a preset phase-shifting phase corresponding to M times the first phase (or M times the second phase), where $1 \leq M \leq N$, and N is the total number of transmission line phase-shifting units in the phase shifting system. By using at least two actual phases detected, the phase calibration circuit calculates phase calibration information for each transmission line phase-shifting unit and stores the phase calibration information for each transmission line phase-shifting unit in the memory. The calculation performed by the phase calibration circuit includes equal-division of the phase deviation and conversion between phases and electrical parameters, and the like.

In order to obtain the actual phase shifting amount of the RF signal, in some examples, the calibration circuit may preset parameters for calibration such as an initial phase of the RF signal, a phase shifting value in each phase state, or a phase shifting amount, and accordingly control the transmission line phase shifter to perform a corresponding phase shifting operation, so as to obtain the actual phase shifting amount. In other examples, the phase collection circuit includes a RF collection circuit, a modulation circuit, and a frequency conversion circuit. The RF collection circuit is coupled to an output terminal of the phase shifting system, and is configured to collect a RF signal output from the phase shifting system to output a RF sampling signal. The RF collection circuit can be a single-ended coupler or a quadrature coupler.

The modulation circuit is coupled to the RF collection circuit and configured to input a first baseband signal to modulate the RF sampling signal by using the first baseband signal to output a modulation signal containing an actual phase. The first baseband signal may be an intermediate frequency (IF) signal, and an initial phase of the IF signal may be any phase. The modulation circuit is configured to modulate the two signals (i.e., the RF sampling signal and the first baseband signal) so that the modulation signal obtained carries the actual phase. The modulation circuit may be a single-ended modulation circuit or a quadrature modulation circuit.

The frequency conversion circuit is coupled to the modulation circuit and configured to input a LO signal to perform down-conversion operation on the modulation signal by using the LO signal to generate a second baseband signal containing an actual phase. The LO signal is the input RF signal of the phase shifting system. The frequency conversion circuit obtains the second baseband signal including the actual phase by performing the down-conversion operation. A frequency of the second baseband signal is substantially the same as that of the first baseband signal. Therefore, before calibration, the phase collection circuit is configured to convert the RF signal carrying the actual phase shifting amount into a baseband signal (i.e., the second baseband signal) carrying the actual phase by using the first baseband signal and the LO signal. The frequency conversion circuit may be a single-ended frequency conversion circuit or a quadrature frequency conversion circuit.

The phase calibration circuit is a digital circuit including the ADC converter. The phase calibration circuit is configured to convert the second baseband signal into a second baseband digital signal, convert the second baseband digital signal to a frequency domain, and obtain an actual phase of the second baseband digital signal. The actual phase includes a sum of the initial phase of the LO signal, an initial phase of the first baseband signal, and an actual phase of the transmission line phase shifter. The phase calibration circuit can obtain an actual phase after calibration of the transmission line phase shifter by performing data calculation according to preset initial phase values.

In some examples, the phase collection circuit is configured to output a second baseband signal including a quadrature signal through a circuit combination of the circuit modules described above. Thus, the phase calibration circuit can eliminate the initial phase in the LO signal and the initial phase in the first baseband signal, such that accuracy of the calibration can be improved. Each of the initial phase values can also be obtained by performing phase detection on the first baseband signal or the LO signal, thereby further reducing the calibration deviation caused during operation of the calibration circuit.

The phase shifting control signal in the phase shifting system is indicative of the phase calibration information, so that the phase shifting system can more accurately perform the phase shifting operation according to an integer multiple of the first phase after calibration (or an integer multiple of the second phase after calibration) during operation.

The phase shifting system further includes a phase shifting controller. The phase shifting controller is coupled with each phase adjusting circuit in the phase shifting system to convert each phase shifting control instruction into a corresponding phase shifting control signal. In the system including the calibration circuit, the phase shifting controller is configured to read the pre-stored phase calibration information according to the phase shifting control instruction and generate the corresponding phase shifting control signal. The phase calibration information is determined by calibrating the phase shifter.

The phase shifting controller may be implemented by a digital signal processor (e.g., a microcontroller unit (MCU), a field programmable gate array (FPGA), or a dedicated hardware processor, etc.) in the calibration circuit, or may be configured separately. For example, the phase shifting controller includes a processor, and a codec, and the like. The phase shifting controller and the digital signal processor share a memory. The memory is used for storing the phase calibration information in the phase shifting system. For example, according to the phase shifting information in the input phase shifting control instruction, the phase shifting controller is configured to determine transmission line phase-shifting units providing phase shifting according to the calibrated first phase and determine transmission line phase-shifting units providing phase shifting according to the calibrated second phase, generate coded signals each used for controlling a corresponding transmission line phase-shifting unit, convert each coded signal into a corresponding phase shifting control signal through the codec, and output a respective phase shifting control signal to a phase adjusting circuit of each transmission line phase-shifting unit.

The phase shifting control instruction may be received from an upper layer system that controls the phase shifting controller. The upper layer system is a software system and/or a hardware system running in an integrated circuit (such as a radar chip) where the phase shifting system is located, or an external system coupled with pins of the integrated circuit. The hardware system in the upper layer system may be shared with or separately from the phase shifting controller, the hardware system may include, for example, a processor or the like. The software system may include programs that can be executed by the hardware system according to time sequence. The phase shifting control instruction may be a level signal or a program instruction.

For the phase shifting system including the RF inverter and the transmission line phase shifter, the phase shifting controller is further configured to output a phase shifting control signal to a phase adjusting circuit in the RF inverter according to the phase shifting control instruction. Therefore, various calibrable phase shifting in a range of 360° and with an unit phase shifting as a phase shifting step are realized.

For example, as shown in FIGS. 7A and 7B, the single-ended signal interface of the RF inverter is the input interface, and the differential signal interface of the RF inverter is the output interface. When the phase shifting controller controls the switch tube SW_P in the phase adjusting circuit of the RF inverter to be turned off and the switch tube SW_N in the phase adjusting circuit of the RF inverter to be turned on, the RF inverter outputs an in-phase RF signal. When the phase shifting controller controls the switch tube SW_P to be turned on and the switch tube SW_N to be turned off, the RF inverter outputs an inverted RF signal. For another example, as shown in FIGS. 7C and 7D, the differential signal interface of the RF inverter is the input interface, and the single-ended signal interface is the output interface. When the phase shifting controller controls the switch tube SW_P in the phase adjusting circuit of the RF inverter to be turned off and the switch tube SW_N in the phase adjusting circuit of the RF inverter to be turned on, the RF inverter outputs an in-phase differential RF signal. When the phase shifting controller controls the switch tube SW_P to be turned on and the switch tube SW_N to be turned off, the RF inverter outputs an inverted differential RF signal.

Correspondingly, each phase adjusting circuit in the transmission line phase shifter includes an adjustable device that can be adjusted according to a phase shifting control signal to enable the transmission line phase shifter to perform a phase shifting operation according to the calibrated phase. For example, the capacitance adjusting circuit includes a switched capacitor array, a varactor diode, or a device with adjustable capacitance such as an adjustable capacitor. The inductance adjusting circuit includes a switch tube, an adjustable resistor, or a device with adjustable inductance or adjustable resistance such as an adjustable inductor.

It is to be noted that the capacitance adjusting circuit and the inductance adjusting circuit may further include fixed devices (such as fixed capacitors or fixed resistors) of a controlled access circuit (or controlled non-access circuit), so that the overall capacitance parameters and inductance parameters of the transmission line phase shifter meet the requirements of phase shifting and impedance matching in the first phase (or the second phase) state.

Figure 9A:
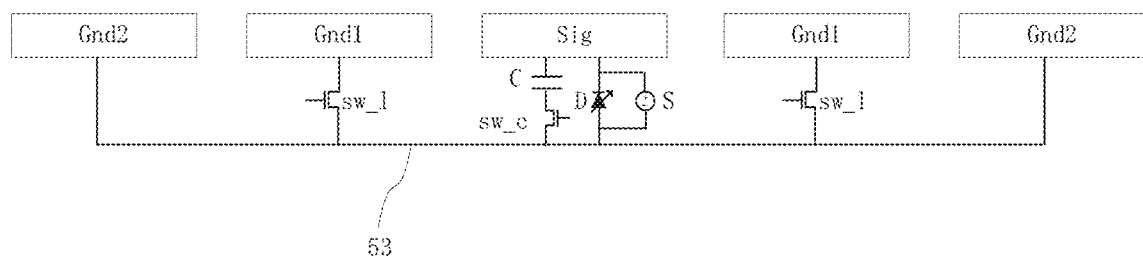
FIGS. 9A and 9B are schematic structural diagrams illustrating a transmission line phase shifter according to other exemplary embodiments of the disclosure.

In one example, the transmission line phase shifter includes cascaded single-ended transmission line phase-shifting units. As illustrated in FIG. 9A, each transmission line phase-shifting unit includes a single-ended signal line Sig, a first pair of ground wires Gnd1, a second pair of ground wires Gnd2, a phase adjusting circuit, and a second bridge 53. The phase adjusting circuit includes a capacitance adjusting circuit, etc. The capacitance adjusting circuit includes a varactor diode D, an adjustable power supply S, and a controlled capacitance circuit. The controlled capacitor circuit includes a switch tube sw_c and a capacitor C. The capacitor C and the switch tube sw_c are connected in series between the signal line Sig and the second bridge 53. The varactor diode D is connected between the signal line Sig and the second bridge 53 and is connected in parallel with a series circuit of the capacitor C and the switch tube sw_c. The adjustable power supply S is configured to output an adjustable voltage (or current) according to an input phase shifting control signal, and the varactor diode D is configured to adjust a capacitance value under the control of the adjustable voltage (or current), so that capacitance parameters of the transmission line phase-shifting unit meet the requirements of capacitance parameters required by the corresponding first phase (or the second phase). The phase adjusting circuit further includes an inductance adjusting circuit. The inductance adjusting circuit includes a corresponding switch tube sw_l connected between each of the first pair of ground wires and the second bridge 53. Each switch tube sw_l is turned on or off according to the input phase shifting control signal, to enable the RF signal to be transmitted on the first pair of ground wires or the second pair of ground wires. The switch tubes sw_l are used for adjusting inductance parameters formed by the first pair of ground wires or the second pair of ground wires under the control of a switch voltage so that the inductance parameters of the transmission line phase-shifting unit meet the requirements of inductance parameters required for the corresponding first phase (or the second phase). When the input phase shifting control signal is used for indicating that the transmission line phase-shifting unit performs a phase shifting operation according to the first phase, the switch tube sw_c is turned off, each switch tube sw_l is turned on, and a voltage (current) value outputted by the adjustable power supply is adjusted to enable the varactor diode to provide a first capacitance value. Therefore, the first pair of ground wires Gnd1 and the signal line Sig in the single-ended transmission line phase-shifting unit form a transmission path for transmitting the RF signal, and the varactor diode provides a capacitance value for calibrating the first phase. When the input phase shifting control signal is used for indicating that the transmission line phase-shifting unit performs a phase shifting operation according to the second phase, the switch tube sw_c is turned on, each switch tube sw_l is turned off, and a voltage (current) value of the adjustable power supply is adjusted to enable the varactor diode to provide a second capacitance value. Therefore, the second pair of ground wires Gnd2 and the signal line Sig in the single-ended transmission line phase-shifting unit form a transmission path for transmitting the RF signal, and the varactor diode provides a compensation capacitance value for calibrating the second phase. In this way, the transmission line phase-shifting unit in different phase states meets the requirement of impedance matching of a RF transmission link where the transmission line phase-shifting unit is located.

Figure 9B:
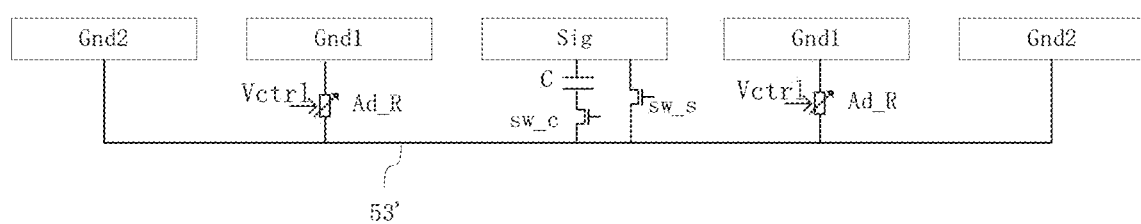

The calibratable transmission line phase-shifting unit shown in FIG. 9A above is a transmission line phase-shifting unit for calibrating each phase shifting amount by adjusting capacitance parameters. Different from FIG. 9A, the transmission line phase-shifting unit shown in FIG. 9B is a transmission line phase-shifting unit for calibrating each phase shifting amount by adjusting inductance parameters. As shown in FIG. 9B, the single-ended transmission line phase-shifting unit includes a single-ended signal line Sig, a first pair of ground wires Gnd1, a second pair of ground wires Gnd2, a phase adjusting circuit, and a second bridge 53'. The phase adjusting circuit includes an inductance adjusting circuit and a capacitance adjusting circuit. The capacitance adjusting circuit includes a switch tube sw_c, a switch tube sw_s, and a capacitor C. The capacitor C and the switch tube sw_c are connected in series between the signal line Sig and the second bridge 53', and the switch tube sw_s is connected between the signal line Sig and the second bridge 53' and is in parallel with a series circuit including the capacitor C and the switch tube sw_c. The inductance adjusting circuit includes variable resistors Ad_R each being connected between a respective ground wire Gnd1 of the first pair of ground wires Gnd1 and the second bridge 53'. A resistance value of each variable resistor Ad_R is adjusted according to a corresponding input phase shifting control signal Vctrl to shunt a RF signal to be transmitted on the first pair of ground wires Gnd1 and the second pair of ground wires Gnd2. In other words, the variable resistors Ad_R are used for adjusting inductance parameters formed by the first pair of ground wires Gnd1 and the second pair of ground wires Gnd2 under the control of an adjustable voltage (or current) so that the inductance parameters of the transmission line phase-shifting unit meet the requirements of inductance parameters required for the corresponding first phase (or second phase). When the input phase shifting control signal is used for indicating that the transmission line phase-shifting unit performs a phase shifting operation according to the first phase, the switch tube sw_s is turned on and the switch tube sw_c is turned off so that the first pair of ground wires Gnd1 and signal lines Sig in the single-ended transmission line phase-shifting unit form a transmission path for transmitting RF signals. In addition, since each variable resistor Ad_R provides a first resistance value, an equivalent inductance formed by the second pair of ground wires Gnd2 and the signal line Sig can be used for providing an inductance value for calibrating the first phase. When the input phase shifting control signal is used for indicating that the transmission line phase-shifting unit performs a phase shifting operation according to the second phase, the switch tube sw_s is turned off and the switch tube sw_c is turned on, so that the second pair of ground wires Gnd2 and the signal line Sig in the single-ended transmission line phase-shifting unit form a transmission path for transmitting RF signals. In addition, since each variable resistor Ad_R provides a second resistance value, an equivalent inductance formed by the first pair of ground wires Gnd1 can be used for providing an inductance value for calibrating the second phase.

Figure 10A:
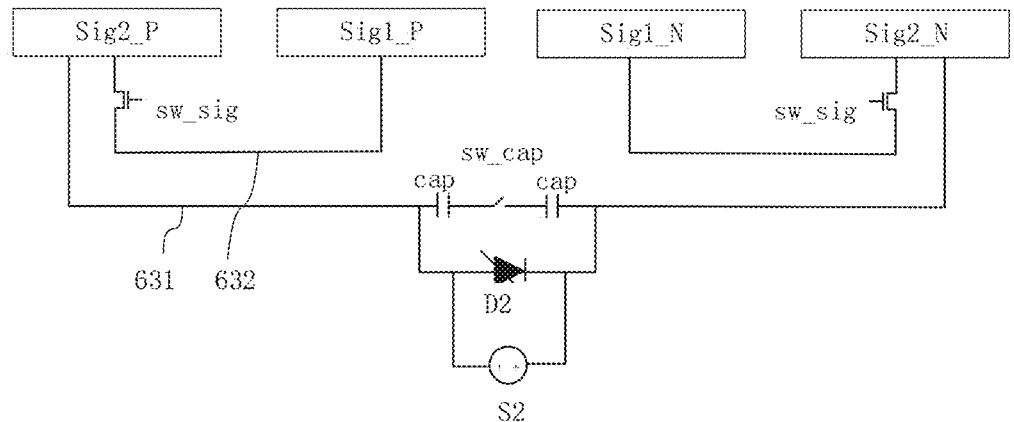
FIGS. 10A and 10B are schematic structural diagrams illustrating a transmission line phase shifter according to other exemplary embodiments of the disclosure.

In another example, the transmission line phase-shifting unit is a differential transmission line phase-shifting unit. As shown in FIG. 10A, the transmission line phase-shifting unit includes a first pair of differential transmission lines (Sig1_P, Sig1_N), a second pair of differential transmission lines (Sig2_P, Sig2_N), a second phase adjusting circuit, and first bridges (631, 632). The second phase adjusting circuit includes a capacitance adjusting circuit, and an inductance adjusting circuit, and the like. The capacitance adjusting circuit includes a varactor diode D2, an adjustable power supply S2, and a controlled capacitance circuit. The controlled capacitor circuit includes a switch tube sw_cap and capacitors cap. The series-connected capacitors cap and the switch tube sw_cap are connected between the second pair of differential transmission lines (Sig2_P, Sig2_N) through the first bridge 631. The varactor diode D2 and the adjustable power supply S2 are also connected between the second pair of differential transmission lines (Sig2_P, Sig2_N). The adjustable power supply S2 outputs an adjustable voltage (or current) according to an input phase shifting control signal, and the varactor diode D2 adjusts a capacitance value under the control of the adjustable voltage (or current), so that the capacitance parameter of the transmission line phase-shifting unit meets the requirements of the capacitance parameter required by the corresponding first phase (or the second phase). The inductance adjusting circuit includes switch tubes sw_sig each being connected between each of the second pair of differential transmission lines (Sig2_P, Sig2_N) and a corresponding first bridge 632. Each switch tube sw_sig is turned on or turned off according to the input phase shifting control signal to enable RF signals to be transmitted on the first pair of ground wires and the second pair of ground wires. The switch tubes sw_sig are used for adjusting inductance parameters formed by the first pair of differential transmission lines or the second pair of differential transmission lines under the control of a switch voltage so that the inductance parameter of the transmission line phase-shifting unit meets the requirements of the inductance parameter required for the corresponding first phase (or the second phase). When the input phase shifting control signal indicates that the transmission line phase-shifting unit performs a phase shifting operation according to the first phase, the switch tube sw_cap is turned off, each switch tube sw_sig is turned on, and the adjustable power supply adjusts an outputted voltage or current to enable the varactor diode to provide a first capacitance value. Therefore, the first pair of differential transmission lines in the differential transmission line phase-shifting unit form a transmission path for transmitting RF signals, and the varactor diode provides a capacitance value for calibrating the first phase. When the input phase shifting control signal indicates that the transmission line phase-shifting unit performs a phase shifting operation according to the second phase, the switch tube sw_cap is turned on, each switch tube sw_sig is turned off, and the adjustable power supply adjusts an outputted voltage or current to enable the varactor diode to provide a second capacitance value. Therefore, the second pair of differential transmission lines in the differential transmission line phase-shifting unit form a transmission path for transmitting the RF signals, and the varactor diode provides a capacitance value for calibrating the second phase.

Figure 10B:
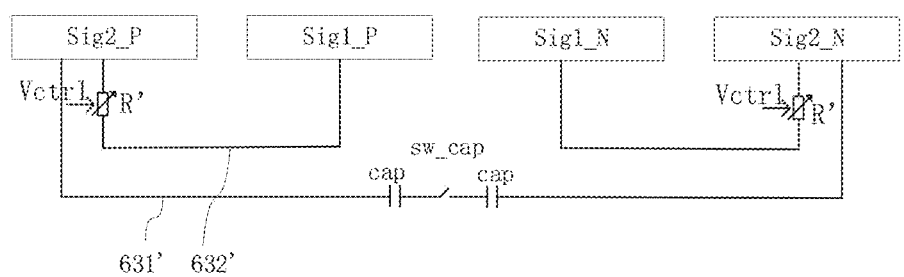

The calibratable transmission line phase-shifting unit shown in FIG. 10A described above is a transmission line phase-shifting unit for calibrating each phase shifting amount by adjusting capacitance parameters. Different from FIG. 10A, the transmission line phase-shifting unit shown in FIG. 10B is a transmission line phase-shifting unit for calibrating each phase shifting amount by adjusting inductance parameters. As shown in FIG. 10B, the differential transmission line phase-shifting unit includes a first pair of differential transmission lines (Sig1_P, Sig1_N), a second pair of differential transmission lines (Sig2_P, Sig2_N), a phase adjusting circuit, and first bridges (631', 632'). The phase adjusting circuit includes a capacitance adjusting circuit, and an inductance adjusting circuit. The capacitance adjusting circuit includes a switch tube sw_cap and capacitors cap. The capacitors cap and the switch tube sw_cap that are connected in series are connected between the second pair of differential transmission lines (Sig2_P, Sig2_N) through the first bridge 631'. The inductance adjusting circuit includes variable resistors R' each being connected between each of the second pair of differential transmission lines (Sig2_P or Sig2_N) and a corresponding first bridge 632'. Each variable resistor R' adjusts a resistance value according to the input phase shifting control signal Vctrl to shunt RF signals transmitted on the first pair of differential transmission lines and the second pair of differential transmission lines. In other words, the variable resistors R' adjusts inductance parameters formed by the first pair of differential transmission lines and the second pair of differential transmission lines under the control of an adjustable voltage (or current). Therefore, the inductance parameter of the transmission line phase-shifting unit meets the requirements of the inductance parameter required for the corresponding first phase (or second phase). When the input phase shifting control signal indicates that the transmission line phase-shifting unit performs a phase shifting operation according to the first phase, the switch tube sw_cap is turned off, such that a first pair of differential transmission lines (Sig1_P, Sig1_N) in the differential transmission line phase-shifting unit form a transmission path for transmitting the RF signals, and a first resistance value provided by each variable resistor R' can cause the second pair of differential transmission lines (Sig2_P, Sig2_N) to shunt the RF signals in the first pair of differential transmission lines such that an equivalent inductance formed can be used for providing an inductance value for calibrating the first phase. When the input phase shifting control signal indicates that the transmission line phase-shifting unit performs a phase-shifting operation according to the second phase, the switch tube sw_cap is turned on, such that a second pair of differential transmission lines (Sig2_P, Sig2_N) in the differential transmission line phase-shifting unit form a transmission path for transmitting the RF signals, and a second resistance value provided by each variable resistor R' can cause the first pair of differential transmission lines (Sig1_P, Sig1_N) to shunt the RF signals in the second pair of differential transmission lines such that an equivalent inductance formed can be used for providing an inductance value for calibrating the second phase.

It is to be noted that the above examples of any of the transmission line phase-shifting units are merely illustrative, and in the calibratable transmission line phase-shifting unit, the corresponding phase state can be calibrated by adjusting both the inductance parameter and the capacitance parameter. By adjusting the inductance parameter and/or capacitance parameter, it is possible to achieve that the transmission line phase-shifting unit in different phase states can simultaneously match the impedance of the RF transmission link where the transmission line phase-shifting unit is located. Impedance matching means that a ratio of the capacitance parameter to the inductance parameter of the transmission line phase-shifting unit remains unchanged.

In addition, in the above examples, the capacitance adjusting circuit may further include a separate adjustable capacitance circuit for calibration. The inductance adjusting circuit may further include a separate adjustable inductance circuit for calibration. Moreover, a circuit for calibrating capacitance parameters in the capacitance adjusting circuit is not limited to the varactor diode, but may also be a controlled circuit such as a switched capacitor array, and capacitors and the switch tube that are connected in series. For example, the capacitance adjusting circuit can use the encoded phase shifting control signal to adjust the switched capacitor array instead of an adjustable capacitance circuit with a combination of fixed capacitors and varactor diodes, so as to simplify the capacitance adjusting circuit. Similarly, a circuit for calibrating inductance parameters in the inductance adjusting circuit is not limited to the switch tube and the variable resistor, but may also be a controlled circuit such as a switch resistor array. The capacitance adjusting circuit and/or the inductance adjusting circuit may also comprehensively consider inductance/capacitance changes between calibrated different phase states to provide a phase adjusting circuit that have both calibration and phase shifting functions to meet the requirements of circuit integration or other circuit design requirements of the transmission line phase-shifting unit in the integrated circuits.

In addition, the capacitance adjusting circuit and/or the inductance adjusting circuit as a whole or part of the controlled circuit can also adopt an arrangement mode different from that in the illustration, such that impedance matching and phase shifting can be simultaneously achieved by adjusting capacitance parameters and/or inductance parameters in different phase states.

Figure 13:
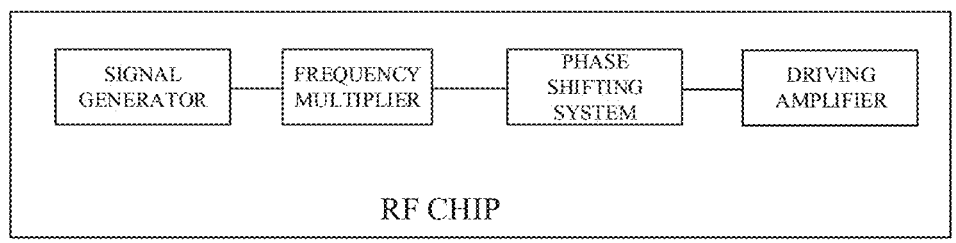
FIG. 13 is a schematic structural diagram illustrating a RF chip according to exemplary embodiments of the disclosure.

Embodiments of the disclosure further provide a RF chip. As shown in FIG. 13, the RF chip includes a signal generator, a frequency multiplier, a phase shifting system, and a driving amplifier.

The signal generator generates an intermediate frequency signal according to a clock reference signal. The signal generator includes, for example, a phase locked loop circuit. A voltage controlled oscillator in the phase locked loop circuit is controlled by the loop to generate the intermediate frequency signal. The intermediate frequency signal is for example a frequency modulated continuous wave (FMCW) signal for a radar sensor to perform physical quantity measurement.

The frequency multiplier is coupled with the signal generator and is configured to multiply a frequency of the intermediate frequency signal to a frequency of a RF signal. That is, the frequency multiplier is configured to multiply the intermediate frequency signal to a RF frequency band. The following takes a radar chip as an example, the frequency multiplier is configured to multiply the FMCW signal to a millimeter wave frequency band.

The phase shifting system is configured to perform phase shifting on the RF signal under the control of a phase shifting control signal, so that an output RF signal has no phase shifting or a phase shifting amount within a range of 0 to 360° in relative to an input RF signal.

In one example, the phase shifting system includes N transmission line phase-shifting units connected in a cascaded manner. Under the control of a phase shifting controller, M transmission line phase-shifting units of the N transmission line phase-shifting units are in a state of a second phase φ and (N−M) transmission line phase-shifting units of the N transmission line phase-shifting units are in a state of a first phase 0. Therefore, the phase shifting system shifts a phase of an input RF signal by Mφ, i.e., a total phase shifting amount of the input RF signal is Mφ.

In one example, the phase shifting system includes a RF inverter and N transmission line phase-shifting units cascaded. Under the control of the phase shifting controller, M transmission line phase-shifting units of the N transmission line phase-shifting units are in the state of the second phase (such as a phase shifting amount is Φ), (N−M) transmission line phase-shifting units of the N transmission line phase-shifting units are in the state of the first phase (such as a phase shifting amount is 0), and the RF inverter is in a phase state of 180°. Therefore, the phase shifting system shifts a phase of an input RF signal by (Mφ+180°), i.e., a total phase shifting amount of the input RF signal is (Mφ+180°).

The driving amplifier is coupled with the phase shifting system to amplify and output the RF signal subjected to phase shifting. The driving amplifier is configured to amplify the RF signal subjected to the phase shifting to a power adapted to a driving post-stage circuit (such as an antenna device) and output the amplified RF signal.

Therefore, the RF chip generates the RF signal subjected to the phase shifting. The RF signal subjected to the phase shifting can be used in the radar sensor to improve the recognition ability of a radar signal, reduce radar interference, perform beamforming and the like by using phase coding. Since the phase shifting system has good linearity, the calibration difficulty is greatly simplified and the accuracy of the phase shifting is improved.

Embodiments of the disclosure further provide a radar sensor. The radar sensor is configured with an antenna array and a RF chip, where the antenna array includes a transmitting antenna and a receiving antenna.

The driving amplifier in the RF chip is configured to convert the RF signal subjected to the phase shifting into a detection signal wave and then send the detection signal wave to a free space through the transmitting antenna. The RF signal subjected to the phase shifting is also called a RF transmission signal.

In order to receive an echo signal wave formed by reflection of the detection signal wave by an object, the RF chip further includes a signal receiver. The signal receiver is configured to mix the input signal by using a RF signal (also called a LO signal) provided by the frequency multiplier to obtain a baseband signal. The baseband signal is converted into a baseband digital signal by an ADC converter and is then output. The RF input signal is obtained by converting the echo signal wave through the receiving antenna. Therefore, the output baseband digital signal includes not only a phase shift caused by a relative position relationship between the radar chip and the object, but also a phase shifting amount performed by the phase shifting system. Due to the phase shifting operation of the phase shifting system, a signal processing circuit coupled to the signal receiver can use the phase shifting amount to perform interference filtering on the baseband digital signal to improve a signal-to-noise ratio of a received signal obtained. Therefore, the signal processing circuit can perform signal processing including a fast Fourier transform (FFT) on the received signal to detect measurement information between the radar chip and objects in the surrounding environment. The measurement information includes at least one of a distance, a relative velocity, and an angle. The signal processing circuit includes, for example, a hardware accelerator, and/or a processor, etc. dedicated to processing baseband digital signals (and/or received signals). The signal processing circuit can be integrated in the RF chip or configured separately to form a main component of the radar sensor.

In one embodiment, embodiments of the disclosure further provide an apparatus. The apparatus includes: an apparatus body; and a radar sensor or a RF chip arranged on the apparatus body as described in above embodiments. The radar sensor is used for target detection. The RF chip may also be used for communication to transmit RF signals carrying at least one of speech, text, and images.

The radar sensor or the RF chip can be arranged outside or inside the apparatus body, or one part of the radar sensor is arranged inside the apparatus body and another part is arranged outside the apparatus body.

It is to be noted that the radar sensor and/or the RF chip can realize functions such as target detection and/or communication by transmitting and receiving radio signals, so as to provide target detection information and/or communication information to the apparatus body, and then assist or even control the operation of the apparatus body.

In an alternative embodiment, the apparatus body may be components and products applied to fields such as smart housing, transportation, smart home, consumer electronics, monitoring, industrial automation, in-cabin detection, and health care. For example, the apparatus body can be intelligent transportation equipment (such as automobiles, bicycles, motorcycles, ships, subways, trains, etc.), security equipment (such as cameras), liquid level/flow rate detection equipment, smart wearable equipment (such as bracelets, glasses, etc.), smart home equipment (such as sweeping robots, door locks, televisions, air conditioners, smart lights, etc.), and various communication equipment (such as mobile phones, tablets, etc.) as well as road gates, intelligent traffic lights, intelligent signs, traffic cameras, and various industrial mechanical arms (or robots), etc. The apparatus body can also be various instruments for detecting life characteristic parameters and various equipment equipped with the instruments, such as automobile cabin detection, indoor personnel monitoring, intelligent medical equipment, consumer electronic equipment, etc.

In yet another alternative embodiment, when the above-mentioned apparatus body is applied to an advanced driving assistance system (ADAS), the radar sensor (such as a millimeter wave radar) as an on-board sensor can provide various functional safety guarantees for the ADAS system, such as autonomous emergency braking (AEB), blind spot detection (BSD), life cycle assessment (LCA), rear cross traffic alert (RCTA), etc. Especially on the road with complex electromagnetic environment, this scheme can improve the detection accuracy by using the higher resolution and more accurate phase shifting provided by the phase shifting system. Therefore, the timeliness and reliability of automatic auxiliary function of the ADAS are improved.

It can be clearly understood that the disclosure describes how particular examples are formed and used but the disclosure is not limited to any detail of these examples. Instead, these principles can be applied to many other embodiments based on the teachings of the contents disclosed herein.

Exemplary embodiments of the disclosure are specifically shown and described above. It can be understood that the disclosure is not limited to the detailed structure arrangement or implementation described herein. Rather the disclosure is intended to cover various modifications and equivalent settings contained within the spirit and scope of the appended claims.

What is claimed is:

1. A phase shifting system, comprising a transmission line phase shifter and a radio frequency (RF) inverter, wherein
the RF inverter comprises an inductance circuit arranged symmetrically along a symmetry axis and a first phase adjusting circuit arranged symmetrically along the symmetry axis, wherein the inductance circuit comprises a single-ended signal interface and a differential signal interface, and the first phase adjusting circuit comprises two controlled switches, wherein each controlled switch of the two controlled switches is connected between a ground wire of the RF inverter and a corresponding ground terminal of a pair of ground terminals in the single-ended signal interface, to enable the inductance circuit to perform in-phase or inverting phase shifting on a RF signal received; and
the transmission line phase shifter comprises a single-ended transmission line phase shifter coupled with the single-ended signal interface of the RF inverter or a differential transmission line phase shifter coupled with the differential signal interface of the RF inverter.

2. The phase shifting system of claim 1, wherein the inductance circuit comprises:
a first inductor that is symmetrically arranged along a tap line of the inductance circuit, wherein the tap line is connected to a single-ended signal terminal in the single-ended signal interface; and
a second inductor coupled to the first inductor, wherein the second inductor is symmetrically arranged along the tap line and has the differential signal interface.

3. The phase shifting system of claim 1, wherein
the single-ended signal interface is used as a signal input interface and the differential signal interface is used as a signal output interface; or
the single-ended signal interface is used as the signal output interface and the differential signal interface is used as the signal input interface.

4. The phase shifting system of claim 1, wherein:
the single-ended signal interface is connected to a pair of ground wires in a group of transmission lines in the single-ended transmission line phase shifter and is physically isolated from a pair of ground wires in another group of transmission lines in the single-ended transmission line phase shifter; and
the differential signal interface is connected to a pair of differential transmission lines in the differential transmission line phase shifter and is isolated from another pair of differential transmission lines in the differential transmission line phase shifter.

5. The phase shifting system of claim 1, wherein the differential transmission line phase shifter comprises at least one differential transmission line phase-shifting unit, and each differential transmission line phase-shifting unit comprises a first pair of differential transmission lines, a second pair of differential transmission lines, and a second phase adjusting circuit; wherein
the second phase adjusting circuit is coupled to the first pair of differential transmission lines and the second pair of differential transmission lines, and is configured to adjust a capacitance parameter and/or an inductance parameter of the each differential transmission line phase-shifting unit according to a corresponding phase shifting control signal received, so as to perform phase shifting on the RF signal according to a first phase or a second phase.

6. The phase shifting system of claim 5, wherein the first pair of differential transmission lines is disposed between the second pair of differential transmission lines, and differential signal terminals in the differential signal interface are correspondingly coupled with the second pair of differential transmission lines.

7. The phase shifting system of claim 1, wherein the single-ended transmission line phase shifter comprises at least one single-ended transmission line phase-shifting unit, and each single-ended transmission line phase-shifting unit comprises a single-ended signal line, a first pair of ground wires, a second pair of ground wires, and a third phase adjusting circuit; wherein
the third phase adjusting circuit is configured to adjust an inductance parameter and/or a capacitance parameter of the each single-ended transmission line phase-shifting unit according to a corresponding phase shifting control signal received, so as to perform phase shifting on the RF signal according to a first phase or a second phase.

8. The phase shifting system of claim 7, wherein the single-ended signal line is disposed between the first pair of ground wires, and the single-ended signal line and the first pair of ground wires are disposed between the second pair of ground wires; and
a single-ended signal terminal in the single-ended signal interface is coupled with the single-ended signal line, and the ground wire on the side of the single-ended signal interface is coupled with the second pair of ground wires.

9. The phase shifting system of claim 1, further comprising: a phase shifting controller, wherein
the phase shifting controller is coupled to the transmission line phase shifter and the RF inverter to selectively control at least one of the transmission line phase shifter and the RF inverter to perform phase shifting.

10. The phase shifting system of claim 1, wherein the transmission line phase shifter comprises a plurality of transmission line phase-shifting units cascaded, and the plurality of transmission line phase-shifting units have a same phase shifting amount; wherein the phase shifting system is configured to perform phase shifting in a range of 360° on the RF signal by taking the phase shifting amount as a phase shifting step.

11. A radio frequency (RF) chip, comprising a phase shifting system, wherein the phase shifting system comprises: a transmission line phase shifter and a RF inverter, wherein the RF inverter comprises an inductance circuit arranged symmetrically along a symmetry axis and a first phase adjusting circuit arranged symmetrically along the symmetry axis, wherein the inductance circuit comprises a single-ended signal interface and a differential signal interface, and the first phase adjusting circuit comprises two controlled switches, wherein each controlled switch of the two controlled switches is connected between a ground wire of the RF inverter and a corresponding ground terminal of a pair of ground terminals in the single-ended signal interface, to enable the inductance circuit to perform in-phase or inverting phase shifting on a RF signal received; and the transmission line phase shifter comprises a single-ended transmission line phase shifter coupled with the single-ended signal interface of the RF inverter or a differential transmission line phase shifter coupled with the differential signal interface of the RF inverter.

12. The RF chip of claim 11, wherein the inductance circuit comprises:

a first inductor that is symmetrically arranged along a tap line of the inductance circuit, wherein the tap line is connected to a single-ended signal terminal in the single-ended signal interface; and a second inductor coupled to the first inductor, wherein the second inductor is symmetrically arranged along the tap line and has the differential signal interface.

13. The RF chip of claim 11, wherein the single-ended signal interface is used as a signal input interface and the differential signal interface is used as a signal output interface; or the single-ended signal interface is used as the signal output interface and the differential signal interface is used as the signal input interface.

14. The RF chip of claim 11, wherein:

the single-ended signal interface is connected to a pair of ground wires in a group of transmission lines in the single-ended transmission line phase shifter and is physically isolated from a pair of ground wires in another group of transmission lines in the single-ended transmission line phase shifter; and the differential signal interface is connected to a pair of differential transmission lines in the differential transmission line phase shifter and is isolated from another pair of differential transmission lines in the differential transmission line phase shifter.

15. The RF chip of claim 11, wherein the differential transmission line phase shifter comprises at least one differential transmission line phase-shifting unit, and each differential transmission line phase-shifting unit comprises a first pair of differential transmission lines, a second pair of differential transmission lines, and a second phase adjusting circuit; wherein the second phase adjusting circuit is coupled to the first pair of differential transmission lines and the second pair of differential transmission lines, and is configured to adjust a capacitance parameter and/or an inductance parameter of the each differential transmission line phase-shifting unit according to a corresponding phase shifting control signal received, so as to perform phase shifting on the RF signal according to a first phase or a second phase.

16. The RF chip of claim 15, wherein the first pair of differential transmission lines is disposed between the second pair of differential transmission lines, and differential signal terminals in the differential signal interface are correspondingly coupled with the second pair of differential transmission lines.

17. The RF chip of claim 11, wherein the single-ended transmission line phase shifter comprises at least one single-ended transmission line phase-shifting unit, and each single-ended transmission line phase-shifting unit comprises a single-ended signal line, a first pair of ground wires, a second pair of ground wires, and a third phase adjusting circuit; wherein the third phase adjusting circuit is configured to adjust an inductance parameter and/or a capacitance parameter of the each single-ended transmission line phase-shifting unit according to a corresponding phase shifting control signal received, so as to perform phase shifting on the RF signal according to a first phase or a second phase.

18. The RF chip of claim 11, wherein the phase shifting system further comprises:

a phase shifting controller, wherein the phase shifting controller is coupled to the transmission line phase shifter and the RF inverter to selectively control at least one of the transmission line phase shifter and the RF inverter to perform phase shifting.

19. A radar sensor, comprising:

a transmitting antenna configured to radiate a RF transmitting signal in a form of a detection signal wave;

a receiving antenna configured to convert a detected echo signal wave into a RF receiving signal; wherein the echo signal wave is formed by reflection of the detection signal wave by an object; and the RF chip of claim 11, wherein the RF chip is coupled to the transmitting antenna and the receiving antenna, and is configured to output a RF transmitting signal subjected to phase shifting to the transmitting antenna and convert the RF receiving signal into a baseband digital signal.

20. An apparatus comprising:

the RF chip of claim 11; and an apparatus body, wherein the RF chip is arranged on the apparatus body.

\* \* \* \* \*